United States Patent
Chang et al.

(10) Patent No.: US 10,082,823 B1
(45) Date of Patent: Sep. 25, 2018

(54) OPEN LOOP SOLUTION IN DATA BUFFER AND RCD

(71) Applicant: Integrated Device Technology, Inc., San Jose, CA (US)

(72) Inventors: David Chang, Santa Clara, CA (US); Xudong Shi, San Jose, CA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/729,802

(22) Filed: Oct. 11, 2017

(51) Int. Cl.
*G06F 1/10* (2006.01)
*H03K 5/05* (2006.01)
*G11C 7/22* (2006.01)
*H03L 7/08* (2006.01)
*G06F 1/08* (2006.01)

(52) U.S. Cl.
CPC ............. *G06F 1/10* (2013.01); *G06F 1/08* (2013.01); *G11C 7/222* (2013.01); *H03K 5/05* (2013.01); *H03L 7/08* (2013.01)

(58) Field of Classification Search
CPC ..... G11C 7/222; G11C 7/1066; G11C 7/1072; G11C 7/1093; G11C 11/4076; G11C 2207/2254; G11C 7/10; G11C 7/225; G11C 29/023; G11C 29/022; G11C 29/50012; G11C 7/1069; G11C 29/12015; G11C 11/4096; G11C 7/109; G11C 11/4093; G11C 5/04; G06F 13/1689; G06F 13/36; G06F 1/3225; G06F 3/0625; G06F 3/0629; G06F 13/4217; G06F 1/10; G06F 1/08; G06F 13/4243; G06F 13/4213; G06F 1/12; H03L 7/00; H03L 7/0802; H03L 7/091; H03L 7/099; H03L 7/08; H03L 7/18; H04L 7/0008; H04L 7/0037; H04L 7/033; H04L 7/08; H04L 7/0087; H04L 27/0008; H04L 7/0041; H04L 7/0331; H03K 5/05; H03K 19/017581; H04B 1/7183; G01R 31/3191; G01R 31/31922; G01R 31/31937
See application file for complete search history.

(56) References Cited

U.S. PATENT DOCUMENTS

| | | | |
|---|---|---|---|
| 8,223,584 B1 * | 7/2012 | Clarke | G11C 7/1087 365/189.15 |
| 8,228,747 B2 * | 7/2012 | Onishi | G11C 7/1066 365/191 |

(Continued)

*Primary Examiner* — Vibol Tan
(74) *Attorney, Agent, or Firm* — Christopher P. Maiorana, PC

(57) ABSTRACT

An apparatus comprising an open loop circuit and a delay circuit. The open loop circuit may be configured to generate an in-phase clock signal by performing a phase alignment in response to (i) a clean version of a system clock and (ii) a delayed version of a strobe signal. The delay circuit may be configured to (i) generate the delayed version of the strobe signal in response to (a) the strobe signal received from a memory interface and (b) a delay amount received from a calibration circuit and (ii) adjust a delay of transferring a data signal through the apparatus in response to (a) the delay amount and (b) the in-phase clock signal. The data signal may be received from the memory interface. The delay of transferring the data signal may be implemented to keep a latency of a data transfer within a pre-defined range.

20 Claims, 14 Drawing Sheets

(56) References Cited

U.S. PATENT DOCUMENTS

| | | | |
|---|---|---|---|
| 8,542,787 B2* | 9/2013 | Hampel | G11C 7/10 |
| | | | 327/237 |
| 8,836,394 B2* | 9/2014 | Zerbe | H04L 7/0079 |
| | | | 326/82 |
| 9,166,590 B1* | 10/2015 | Yap | H03K 19/017581 |
| 9,229,470 B2* | 1/2016 | Ware | G06F 13/1689 |
| 9,323,538 B1* | 4/2016 | Blunno | G06F 9/44 |
| 9,437,279 B2* | 9/2016 | Ware | G06F 13/1689 |
| 9,721,642 B2* | 8/2017 | Hampel | G11C 11/4076 |
| 9,830,971 B2* | 11/2017 | Ware | G11C 11/4076 |

* cited by examiner

OPEN LOOP SOLUTION IN DATA BUFFER AND RCD

FIELD OF THE INVENTION

The invention relates to synchronous data transportation generally and, more particularly, to a method and/or apparatus for implementing an open loop solution in data buffer and RCD.

BACKGROUND

In double data rate fourth generation (DDR4) and fifth generation (DDR5), a memory interface (i.e., a registered clock driver or a data buffer) is a source of synchronous data transportation between the host central processing unit (CPU) and the synchronous dynamic random-access memory (SDRAM) modules. Data transmission through a memory interface is bi-directional (i.e., read and write). In order to maintain a timing relationship, a total amount of delay through the memory buffer needs to be constant. The total amount of delay is often referred to as a propagation delay (tPDM) value. Furthermore, signals generated by SDRAM modules have a lot of noise.

The tPDM can be marginally varied around a specified value. The specified value for tPDM for an RCD is 1.2 ns. The specified value for tPDM for a data buffer is 1.5 ns. The conventional solutions use a phase-locked loop (PLL) or a delay-locked loop (DLL) to lock the timing relationship and keep tPDM constant. Conventional solutions also use a delay line and phase blender to adjust the skew to correct pin-to-pin variation due to the layout matching and process, voltage and temperature (PVT) variation.

Conventional circuitry for making tPDM constant is very complicated. Many clock phases need to be generated which makes the timing critical and sensitive to the process. To close the timing using conventional circuitry is very difficult. Furthermore, with a DLL/PLL solution, there is a limitation on the loop bandwidth. For DDR5, with the data rates increasing to 4.4 GHz, 6.6 GHz and higher, loop bandwidth limitation due to PLL/DLL will cause design challenges. Since conventional circuitry uses PLL/DLL internally for phase alignment and to lock all the signals, there are problems when scaling down the process size. The PLL/DLL also consumes a large amount of power.

It would be desirable to implement an open loop solution in data buffer and RCD.

SUMMARY

The invention concerns an apparatus comprising an open loop circuit and a delay circuit. The open loop circuit may be configured to generate an in-phase clock signal by performing a phase alignment in response to (i) a clean version of a system clock and (ii) a delayed version of a strobe signal. The delay circuit may be configured to (i) generate the delayed version of the strobe signal in response to (a) the strobe signal received from a memory interface and (b) a delay amount received from a calibration circuit. The delay circuit may be configured to adjust a delay of transferring a data signal through the apparatus in response to (a) the delay amount and (b) the in-phase clock signal and (iii) present the in-phase clock signal and the data signal to a host interface. The data signal may be received from the memory interface. The delay of transferring the data signal may be implemented to keep a latency of a data transfer within a pre-defined range.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing an open loop solution that may (i) be implemented in a data buffer (DB), (ii) be implemented in a registered clock driver (RCD), (iii) improve a consistency of a latency through a memory interface, (iv) enable an improved bandwidth limitation compared to DLL/PLL solutions, (v) reduce jitter, (vi) be portable to different processes and data rates, (vii) reduce power consumption and/or (viii) be implemented as one or more integrated circuits.

Figure 1:
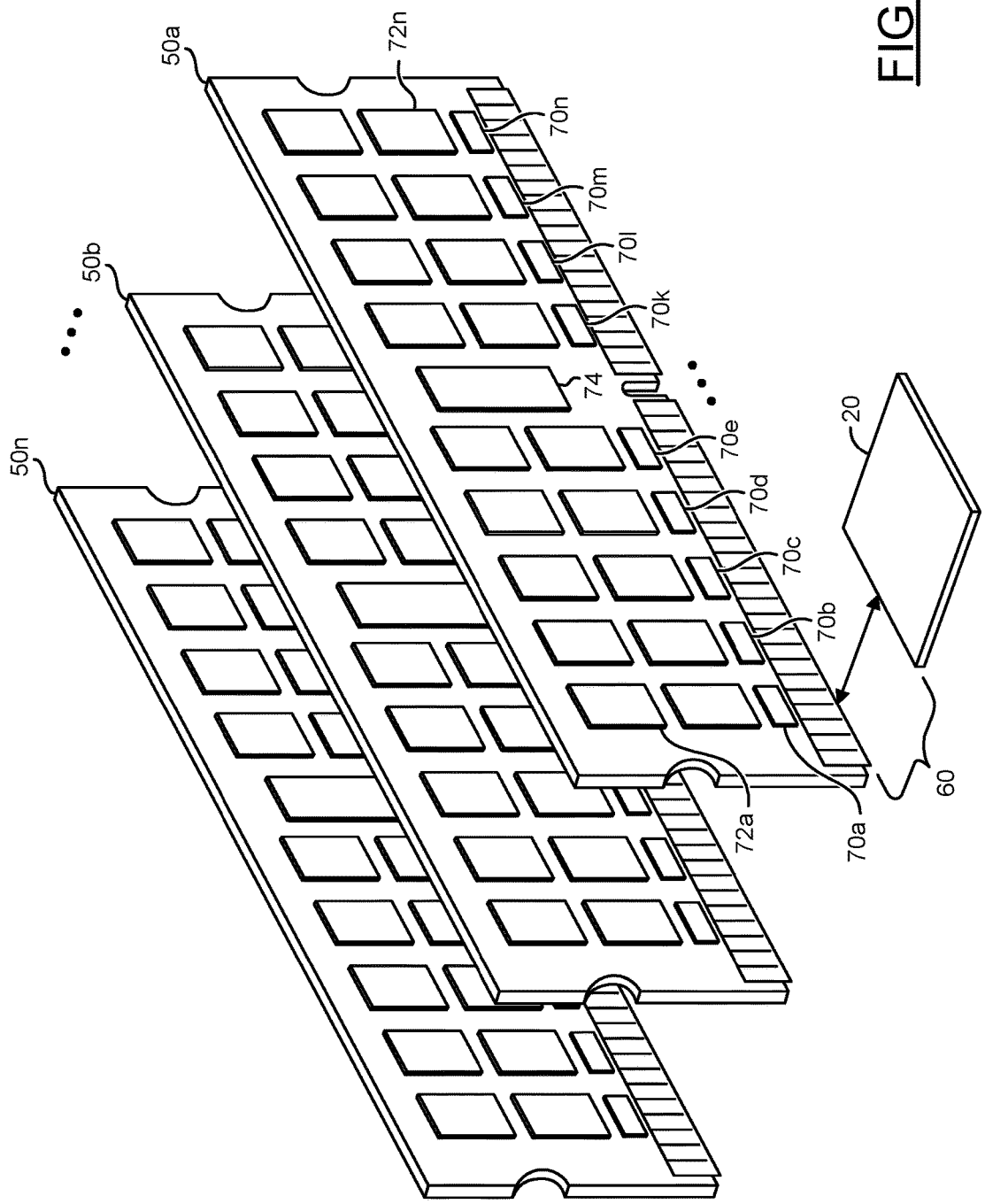
FIG. 1 is a diagram illustrating an example embodiment of a memory system.

Referring to FIG. 1, a diagram of a memory system is shown in accordance with an example embodiment of the invention. In various embodiments, the memory system includes a number of circuits 50a-50n. The circuits 50a-50n may be implemented as memory modules (or boards). In an example, the circuits 50a-50n may be implemented as dual in-line memory modules (DIMMs). In some embodiments, the circuits 50a-50n may be implemented as double data rate fourth generation (DDR4) synchronous dynamic random-access memory (SDRAM) modules. In some embodiments, the circuits 50a-50n may be implemented as double data rate fifth generation (DDR5) SDRAM modules.

In various embodiments, the circuits 50a-50n may comprise a number of blocks (or circuits) 70a-70n, a number of blocks (or circuits) 72a-72n, a block (or circuit) 74 and/or various other blocks, circuits, pins, connectors and/or traces. The circuits 70a-70n may be configured as data buffers. The circuits 72a-72n may implement memory devices. In an example, the circuits 72a-72n may be implemented as synchronous dynamic random-access memory (SDRAM) devices (or chips, or modules). The circuit 74 may be implemented as a registered clock driver (RCD). In an example, the RCD circuit 74 may be implemented as a DDR4 RCD circuit. In another example, the RCD circuit 74 may be implemented as a DDR5 RCD circuit. The type, arrangement and/or number of components of the memory modules 50a-50n may be varied to meet the design criteria of a particular implementation.

The memory modules 50a-50n are shown connected to a block (or circuit) 20. The circuit 20 may implement a memory controller. The circuit 20 may be located in another device, such as a computing engine. Various connectors/pins/traces 60 may be implemented to connect the memory modules 50a-50n to the memory controller 20. In some embodiments, the connectors/pins/traces 60 may be a 288-pin configuration. In an example, the memory controller 20 may be a component of a computer motherboard (or main board). In another example, the memory controller 20 may be a component of a microprocessor. In yet another example, the memory controller 20 may be a component of a central processing unit (CPU).

In an example, some of the connectors/pins/traces 60 may be part of the memory modules 50a-50n and some of the connectors/pins/traces 60 may be part of the motherboard and/or memory controller 20. The memory modules 50a-50n may be connected to the computer motherboard (e.g., by pins, traces and/or connectors 60) to transfer data between components of a computing device and the memory modules 50a-50n. In an example, the memory controller 20 may be implemented on a northbridge of the motherboard and/or as a component of a microprocessor (e.g., an Intel CPU, an AMD CPU, an ARM CPU, etc.). The implementation of the memory controller 20 may be varied according to the design criteria of a particular implementation.

In various embodiments, the circuits 50a-50n may be implemented as DDR4 (or DDR5) SDRAM memory modules. In an example, the circuits 50a-50n may have a memory module density of 512 gigabyte (GB), one terabyte (TB), or higher per module (e.g., compared to 128 GB per dual in-line memory module (DIMM) in DDR3). In embodiments implementing DDR4 SDRAM memory modules, the circuits 50a-50n may operate at voltages of 1.2-1.4 volts (V) with a frequency between 800-4266 megahertz (MHZ) (e.g., compared to 1.5-1.65V at frequencies between 400-1067 MHZ in DDR3). In embodiments, implementing DDR5 SDRAM memory modules, the circuits 50a-50n may operate with a frequency of 4.4 GHz, 6.6 GHz and/or higher frequencies. In some embodiments, the circuits 50a-50n may be implemented as low voltage DDR4 memory modules and operate at 1.05V. For example, in embodiments implementing low voltage DDR4 SDRAM memory modules, the circuits 50a-50n may implement 35% power savings compared to DDR3 memory. In embodiments implementing DDR4 SDRAM memory modules, the circuits 50a-50n may transfer data at speeds of 2.13-4.26 gigatransfers per second (GT/s) and higher (e.g., compared to 0.8-2.13 GT/s in DDR3). The operating parameters of the memory modules 50a-50n may be varied according to the design criteria of a particular implementation.

In an example, the memory modules 50a-50n may be compliant with the DDR4 specification entitled "DDR4 SDRAM", specification JESD79-4A, November 2013, published by the Joint Electron Device Engineering Council (JEDEC) Solid State Technology Association, Arlington, Va. Appropriate sections of the DDR4 specification (e.g., the JEDEC specification) are hereby incorporated by reference in their entirety.

The memory modules 50a-50n may be implemented as DDR4 load reduced DIMM (LRDIMM). The data buffers 70a-70n may allow the memory modules 50a-50n to operate at higher bandwidth and/or at higher capacities compared to DDR4 RDIMM (e.g., 2400 or 2666 MT/s for DDR4 LRDIMM compared to 2133 or 2400 MT/s for DDR4 RDIMM at 384 GB capacity). For example, compared to DDR4 RDIMM configurations, the DDR4 LRDIMM configuration of the memory modules 50a-50n may allow improved signal integrity on data signals and/or better intelligence and/or post-buffer awareness by the memory controller 20.

Figure 2:
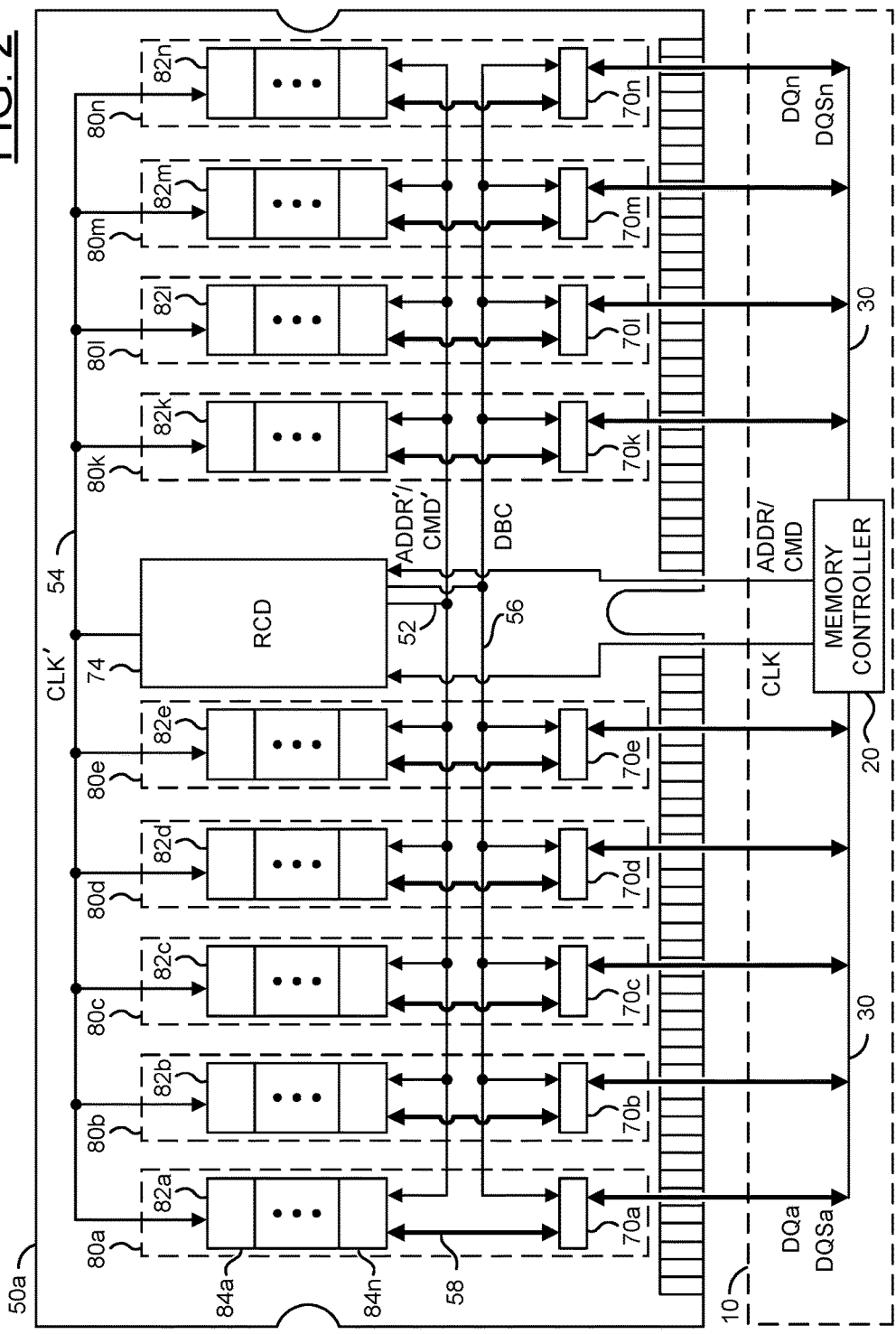
FIG. 2 is a block diagram illustrating a memory module of FIG. 1.

Referring to FIG. 2, a block diagram is shown illustrating a memory module 50a of FIG. 1. The memory module 50a may be representative of the memory modules 50b-50n. The memory module 50a is shown communicating with the memory controller 20. The memory controller 20 is shown as part of a block (or circuit) 10. The circuit 10 may be a motherboard (or main board), or other electronic component or computing engine that communicates with the memory module 50a.

The memory module 50a may comprise one or more blocks (or circuits) 80a-80n and/or the RCD circuit 74. The circuits 80a-80n may implement data paths of the memory module 50a. For example, the data path 80a may include a block 82a and/or the data buffer 70a. The data paths 80b-80n may have similar implementations. The circuits 82a-82n may each be implemented as a memory channel. Each of the memory channels 82a-82n may comprise a number of blocks (or circuits) 84a-84n. The circuits 84a-84n may be implemented as random access memory (RAM) chips. For example, the RAM chips 84a-84n may implement a volatile memory such as dynamic RAM (DRAM). The RAM chips 84a-84n may be the SDRAM devices 72a-72n (e.g., the chips 84a-84n may comprise one or more of the circuits 72a-72n located within one of the memory channels 82a-82n). In some embodiments, the RAM chips 84a-84n may be physically located on both sides (e.g., the front and back) of the circuit board of the memory modules 50a-50n. A capacity of memory on the memory module 50a may be varied according to the design criteria of a particular implementation.

The memory controller 20 may generate a signal (e.g., CLK) and a number of control signals (e.g., ADDR/CMD). The signal CLK and/or the signals ADDR/CMD may be presented to the RCD circuit 74. A data bus 30 may be connected between the memory controller and the data paths 80a-80n. The memory controller 20 may generate and/or receive data signals (e.g., DQa-DQn) and data strobe signals (e.g. DQSa-DQSn) that may be presented/received from the data bus 30. Portions of the signals DQa-DQn and DQSa-DQSn may be presented to respective data paths 80a-80n.

The RCD circuit 74 may be configured to communicate with the memory controller 20, the memory channels 82a-82n and/or the data buffers 70a-70n. The RCD circuit 74 may decode instructions received from the memory controller 20. For example, the RCD circuit 74 may receive register command words (RCWs). In another example, the RCD circuit 74 may receive buffer control words (BCWs). The RCD circuit 74 may be configured to train the DRAM chips 84a-84n, the data buffers 70a-70n and/or command and address lines between the RCD circuit 74 and the memory controller 20. For example, the RCWs may flow from the memory controller 20 to the RCD circuit 74. The RCWs may be used to configure the RCD circuit 74.

The RCD circuit 74 may be used in both LRDIMM and RDIMM configurations. The RCD circuit 74 may implement a 32-bit 1:2 command/address register. The RCD circuit 74 may support an at-speed bus (e.g., a BCOM bus between the RCD circuit 74 and the data buffers 70a-70n).

The RCD circuit 74 may implement automatic impedance calibration. The RCD circuit 74 may implement command/address parity checking. The RCD circuit 74 may control register RCW readback. The RCD circuit 74 may implement a 1 MHz inter-integrated circuit (I$^2$C) bus (e.g., a serial bus). Inputs to the RCD circuit 74 may be pseudo-differential using external and/or internal voltages. The clock outputs, command/address outputs, control outputs and/or data buffer control outputs of the RCD circuit 74 may be enabled in groups and independently driven with different strengths.

The RCD circuit 74 may receive the signal CLK and/or the signals ADDR/CMD from the memory controller 20. Various digital logic components of the RCD circuit 74 may be used to generate signals based on the signal CLK and/or the signals ADDR/CMD and/or other signals (e.g., RCWs). The RCD circuit 74 may also be configured to generate a signal (e.g., CLK') and signals (e.g., ADDR'/CMD'). For example, the signal CLK' may be a signal Y_CLK in the DDR4 specification. The signal CLK' and/or the signals ADDR'/CMD' may be presented to each of the memory channels 82a-82n. For example, the signals ADDR'/CMD' and CLK' may be transmitted on a common bus 52 and a common bus 54, respectively. The RCD circuit 74 may generate one or more signals (e.g., DBC). The signals DBC may be presented to the data buffers 70a-70n. The signals DBC may implement data buffer control signals. The signals DBC may be transmitted on a common bus 56 (e.g., a data buffer control bus).

The data buffers 70a-70n may be configured to receive commands and data from the bus 56. The data buffers 70a-70n may be configured to generate/receive data to/from the bus 30. The bus 30 may comprise traces, pins and/or connections between the memory controller 20 and the data buffers 70a-70n. A bus 58 may carry the data between each of the data buffers 70a-70n and respective memory channels 82a-82n. The data buffers 70a-70n may be configured to buffer data on the buses 30 and 58 for write operations (e.g., data transfers from the memory controller 20 to the corresponding memory channels 82a-82n). The data buffers 70a-70n may be configured to buffer data on the buses 30 and 58 for read operations (e.g., data transfers from the corresponding memory channels 82a-82n to the memory controller 20).

The data buffers 70a-70n may exchange data with the DRAM chips 84a-84n in small units (e.g., 4-bit nibbles). In various embodiments, the DRAM chips 84a-84n may be arranged in multiple (e.g., two) sets. For two set/two DRAM chip (e.g., 84a-84b) implementations, each set may contain a single DRAM chip (e.g., 84a or 84b). Each DRAM chip 84a-84b may be connected to the respective data buffers 70a-70n through an upper nibble and a lower nibble. For two set/four DRAM chip (e.g., 84a-84d) implementations, each set may contain two DRAM chips (e.g., 84a-84b or 84c-84d). A first set may be connected to the respective data buffers 70a-70n through the upper nibble. The other set may be connected to the respective data buffers 70a-70n through the lower nibble. For two set/eight DRAM chip (e.g., 84a-84h) implementations, each set may contain four of the DRAM chips 84a-84h. A set of four DRAM chips (e.g., 84a-84d) may connect to the respective data buffers 70a-70n through the upper nibble. The other set of four DRAM chips (e.g., 84e-84h) may connect to the respective data buffers 70a-70n through the lower nibble. Other numbers of sets, other numbers of DRAM chips, and other data unit sizes may be implemented to meet the design criteria of a particular implementation.

The DDR4 LRDIMM configuration may reduce a number of data loads to improve signal integrity on a data bus (e.g., the bus 30) of the memory module from a maximum of several (e.g., four) data loads down to a single data load. The distributed data buffers 70a-70n may allow DDR4 LRDIMM designs to implement shorter I/O trace lengths compared to DDR3 LRDIMM designs, which use a centralized memory buffer. For example, shorter stubs connected to the memory channels 82a-82n may result in less pronounced signal reflections (e.g., improved signal integrity). In another example, the shorter traces may result in a reduction in latency (e.g., approximately 1.2 nanoseconds (ns), which is 50% less latency than DDR3 buffer memory). In yet another example, the shorter traces may reduce I/O bus turnaround time. For example, without the distributed data buffers 70a-70n (e.g., in DDR3 memory applications) traces would be routed to a centrally located memory buffer, increasing trace lengths up to six inches compared to the DDR4 LRDIMM implementation shown in FIG. 2.

In some embodiments, the DDR4 LRDIMM configuration may implement nine of the data buffers 70a-70n. The memory modules 50a-50n may implement 2 millimeter (mm) frontside bus traces and backside traces (e.g., the connectors/pins/traces 60). A propagation delay through the data buffers 70a-70n may be 33% faster than through a DDR3 memory buffer (e.g., resulting in reduced latency). In some embodiments, the data buffers 70a-70n may be smaller (e.g., a reduced area parameter) than a data buffer used for DDR3 applications.

Figure 3:
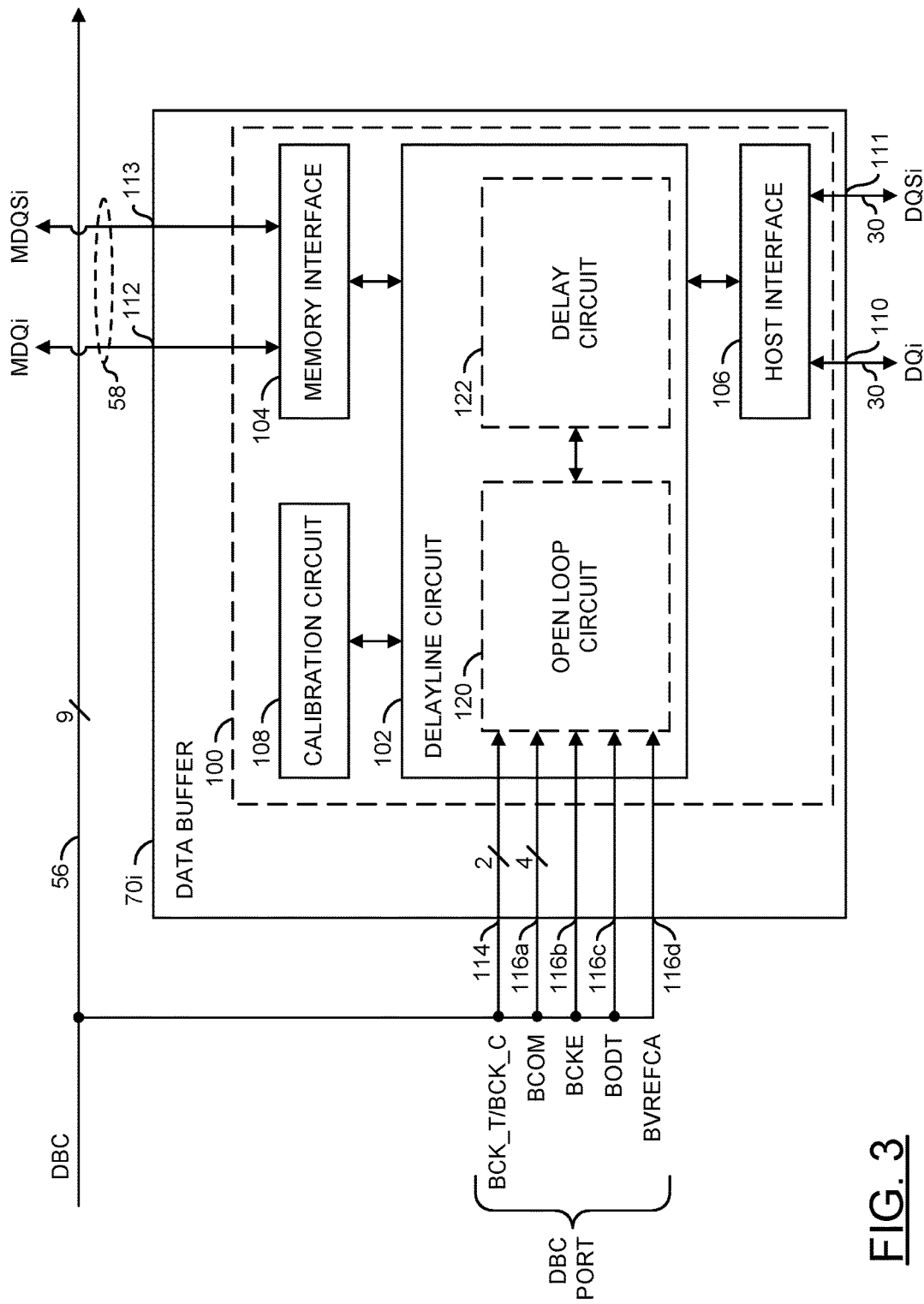
FIG. 3 is a block diagram illustrating an example data buffer of FIG. 1.

Referring to FIG. 3, a diagram is shown illustrating a data buffer 70i in accordance with an example embodiment of the invention. The data buffer 70i may be representative of an example embodiment of the data buffers 70a-70n. The data buffer 70i is shown having a first input/output 110, a second input/output 111, a third input/output 112 and a fourth input/output 113.

The first input/output 110 is configured for presenting/receiving the signals DQi (e.g., the data signals DQ corresponding to a memory channel) between the data buffer 70i and the controller 20. The second input/output 111 is configured for presenting/receiving the signals DQSi (e.g., the data strobe signals DQS corresponding to the memory channel) between the data buffer 70i and the controller 20. The third input/output 112 is configured for presenting/receiving the signals DQi as memory input/output signals (e.g., MDQi) corresponding to a memory channel between the data buffer 70i and the respective memory devices (e.g., DRAM chips) 72a-72n. The fourth input/output 113 is configured for presenting/receiving the signals DQSi as memory input/output signals (e.g., MDQSi) corresponding to a memory channel between the data buffer 70i and the respective memory devices (e.g., DRAM chips) 72a-72n.

The signals MDQi and/or MDQSi are generally transmitted between the memory modules 72a-72n and the respective data buffer 70a-70n. In an example, data (e.g., the signals DQi) and/or a data strobe (e.g., the signal DQSi) from the memory controller 20 may be presented to the data buffer 70i, buffered in the data buffer 70i, then transmitted to the respective memory device(s) 72a-72n. In another example, data from the respective memory device(s) 72a-72n (e.g., MDQi) and/or a data strobe (e.g., the signal MDQSi) may be presented to the data buffer 70i, buffered in the data buffer 70i, and then transmitted on an appropriate memory channel to the memory controller 20.

The data buffer 70i is shown also receiving signals (e.g., DBC) from the bus 56 at a control port (e.g., DBC PORT). The signals DBC may be presented to the data buffers 70a-70n (e.g., using the data buffer control bus 56). In an example, the signals DBC are illustrated comprising five signals transmitted over 9 pins/bits (e.g., a pair of signals BCK_T/BCK_C, a signal BCOM, a signal BCKE, a signal BODT and/or a signal BVREFCA). However, other numbers of pins/bits may be implemented accordingly to meet the design criteria of a particular application. The control port of the data buffer 70i is shown having an input 114 receiving the signals BCK_T/BCK_C, an input 116a receiving the signal BCOM, an input 116b receiving the signal BCKE, an input 116c receiving the signal BODT, and an input 116d receiving the signal BVREFCA.

In various embodiments, the signals BCK_T/BCK_C may be implemented as a 2-bit signal representing a differential (e.g., true (T) and complementary (C) versions) clock signal for the duplex data buffers 70a-70n. In an example, the signals BCK_T/BCK_C may represent a system clock. In various embodiments, the signal BCOM may be implemented as a 4-bit signal representing data buffer commands. However, other numbers of bits may be implemented accordingly to meet the design criteria of a particular application. The signal BCOM may be implemented as a unidirectional signal from the RCD circuit 74 to the data buffers 70a-70n. In an example, the signal BCOM may be implemented at a single data rate (e.g., 1 bit per signal per clock cycle). However, a particular command may take a different number of clock cycles to transfer information. The signal BCKE may be a function registered dedicated non-encoded signal (e.g., DCKE). The signal BODT may be a function registered dedicated non-encoded signal (e.g., DODT). The signal BVREFCA may be a reference voltage for use with pseudo-differential command and control signals.

The data buffers 70a-70n may receive a set of data buffer commands (e.g., for writing buffer control words (BCWs)) from the signals DBC. The buffer control words may be used to customize operation of the data buffers 70a-70n. The buffer control words may flow from the memory controller 20, through the RCD circuit 74, to the data buffers 70a-70n. The buffer control words may be similar to register control words (RCWS) used for configuring the RCD circuit 74. Similar to commands for writing the register control words, the commands for writing the buffer control words may look like an MRS7 command, where the address lines are really the payload.

In embodiments where the bus 56 comprises nine pins, the RCD circuit 74 may do more than pass a buffer control word directly through to the data buffers 70a-70n. In one example, the RCD circuit 74 may convert (e.g., multiplex) an MRS7 command format into a buffer control word in a BCOM format. The RCD circuit 74 may map the 12 address bits of the MRS7 command into five separate data transfers, each 4 bits wide. The five data transfers may be set up back to back over the bus 56. For example, 5 clock cycles plus a parity cycle may be used to complete the buffer command in the buffer control word. Once the buffer control word reaches the data buffers 70a-70n, the data buffers 70a-70n may decode the buffer control word, write the buffer control word to a function space of the data buffer, and complete the buffer command in the buffer control word.

A function of the signal BCOM may be to transmit the buffer control words. However, compliant with the JEDEC specification for DDR4 SDRAM, the RCD circuit 74 may send all read/write commands and MRS information over the bus 56 (e.g., to allow the data buffers 70a-70n to keep track of what the memory devices 72 are doing). In some embodiments, different buffer commands may take a different number of cycles to transfer the information.

The RCD circuit 74 may receive an MRS7 command from the memory controller 20 (e.g., from a host). For example, a host may want to change a parameter (e.g., typically on initialization or boot up of a computing device). The RCD circuit 74 may check the MRS7 command to determine whether the address bit 12 is set to 1 (e.g., a logical one). In an example, when an address bit 12 of the MRS7 command is set to 1, the RCD circuit 74 may recognize the command as a buffer command (e.g., a command that is not meant for the RCD circuit 74). The RCD circuit 74 may convert the command from the memory controller 20 to a buffer control word and send the buffer control word to the data buffers 70a-70n via the bus 56. The data buffers 70a-70n may write the buffer control word to a function space to complete the command.

The data buffers 70a-70n may be configurable. The buffer commands may allow the memory controller 20 to customize aspects of termination (e.g., ODT), signal strength on the DQ lines, and/or events (e.g., receiver timing, driver timing, etc.) in both directions (e.g., for both read and write operations). In some embodiments, some of the configurations of the data buffers 70a-70n may be decided based on system level configurations. Generally, most of the configuration of the data buffers 70a-70n may be decided during training steps. During training steps, host controllers (e.g., the memory controller 20) may test and compare results of various training steps to determine an optimal configuration.

In various embodiments, the bus 56 may be used to send commands/data to program configuration registers of the data buffers 70a-70n. The bus 56 may also send commands (e.g., data reads and/or data writes) that control data traffic through the data buffers 70a-70n. For example, some commands may optimize power consumption and noise filtering (e.g. equalization) of the data buffers 70a-70n. In another example, read/write delays may be added per data line.

The data buffers 70a-70n may implement dual multi-bit (e.g., 4-bit) bi-directional data registers with differential data strobes (e.g., DQS_T/DQS_C). The data buffers 70a-70n may implement automatic impedance calibration. The data buffers 70a-70n may implement BCOM parity checking. The data buffers 70a-70n may implement control register (e.g., buffer control word) readback.

In some embodiments, the data buffers 70a-70n may comprise a block (or circuit or module or apparatus) 100. The circuit 100 implemented in one or more of the data buffers 70a-70n may be configured to implement an open loop architecture and/or digital calibration of a tPDM delay in a double data rate (DDR) memory system. In one example, the circuit 100 may be configured to solve complications and/or bandwidth limits caused by using a DLL and/or PLL in DDR5 when fixing a constant tPDM. In another example, the circuit 100 may be implemented as a fast loop compared to a DLL and/or PLL solution. In yet another example, the open loop architecture of the circuit 100 may reduce an accumulation of jitter in the source synchronization system enabling the data signals (e.g., DQi and/or MDQi) and the clock signals (e.g., DQSi and/or MDQSi) to track each other. The apparatus 100 may be configured to align a strobe (e.g., clock) signal with a data signal to be parallel through a memory data path using a constant delay.

In the example shown, the circuit 100 may comprise a block (or circuit) 102, a block (or circuit) 104, a block (or circuit) 106 and/or a block (or circuit) 108. The circuit 102 may implement a delayline circuit. In some embodiments, the circuit 102 may implement variable delay circuits, phase blender circuits and/or phase interpolator circuits. The circuit 104 may implement a memory interface. The circuit 106 may implement a host interface. The circuit 108 may implement a calibration circuit. The delayline circuit 102 may comprise a block (or circuit) 120 and/or a block (or circuit) 122. The circuit 120 may implement an open loop circuit. The circuit 122 may implement a delay circuit. Details of the circuits 100-108, 120 and/or 122 may be described in association with FIGS. 5-14. The circuit 100 may comprise other components and/or circuits (not shown). The number and/or type of components and/or the signals transmitted between the circuits may be varied according to the design criteria of a particular implementation.

Figure 4:
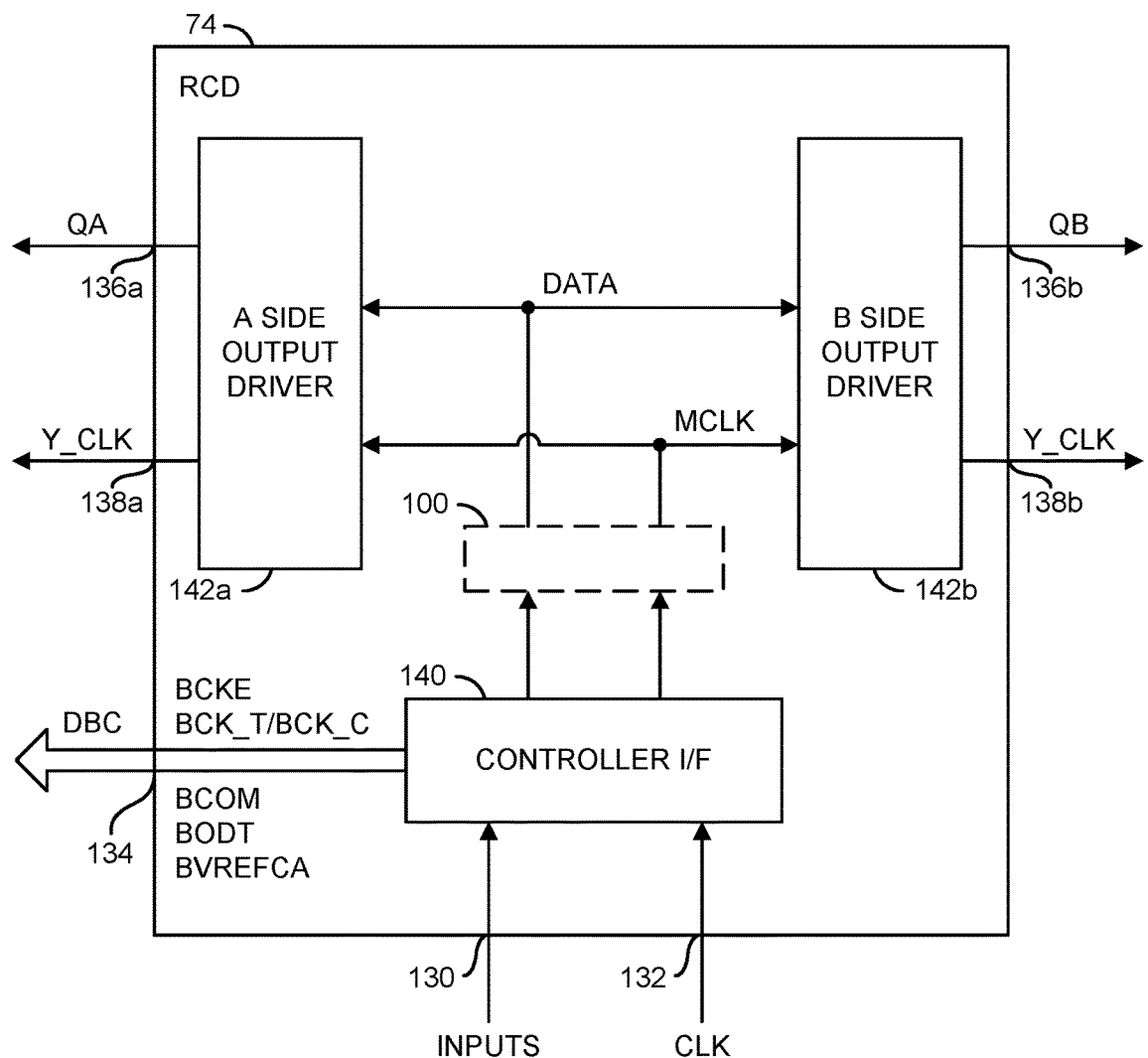
FIG. 4 is a diagram illustrating a registered clock driver (RCD) in accordance with an embodiment of the invention.

Referring to FIG. 4, a diagram is shown illustrating a registered clock driver in accordance with an embodiment of the invention. In various embodiments, a circuit 74 may implement a registered clock driver circuit (or chip). In various embodiments, the circuit 74 may be JEDEC compliant (e.g., compliant with the DDR4 specification entitled "DDR4 SDRAM", specification JESD79-4A, November 2013, published by the Joint Electron Device Engineering Council (JEDEC) Solid State Technology Association, Arlington, Va.).

The circuit 74 may have an input 130 that receives input data (e.g., INPUTS), an input 132 that receives the clock signal CLK, an input/output 134 that may receive/transmit control information (e.g., DBC), outputs 136a and 136b that may provide data outputs (e.g., the Q outputs QA and QB, respectively) and outputs 138a and 138b that may provide output clock signals (e.g., Y_CLK). The signals INPUTS and CLK may be received from a memory controller (e.g., the memory controller 20 in FIG. 1) via a memory bus of a motherboard. In an example, the signals INPUTS may be pseudo-differential using an external or internal voltage reference. The signals INPUTS may comprise the ADDR/CMD signals of FIGS. 1 and 2. In an example, the signal CLK may be implemented as differential clock signals CLK_t (true) and CLK_c (complement). The signals QA, QB, and Y_CLK may be presented to a number of memory chips (e.g., 84a-84n in FIG. 2). For example, the signals QA, QB and Y_CLK may implement an output address and control bus for a DDR4 RDIMM, DDR4 LRDIMM, DDR4 UDIMM and/or DDR5 memory module. The signal DBC may be implemented as a data buffer control bus.

In various embodiments the circuit 74 may comprise a block 140, a block (or circuit) 142a and/or a block (or circuit) 142b. The block 140 may implement a controller interface. The blocks 142a and 142b may implement output driver circuits. In some embodiments, the blocks 142a and 142b may be combined as a single circuit 142. The block 140 may be configured to generate a data signal (e.g., DATA) and a clock signal (e.g., MCLK). The block 140 may be configured to generate the pair of signals BCK_T/BCK_C, the signal BCOM, the signal BCKE, the signal BODT and/or the signal BVREFCA. The signals DATA and MCLK may be presented to the blocks 142a and 142b. In various embodiments, the signal DATA may be coupled to the blocks 142a and 142b by combinatorial logic (not shown). The blocks 142a and 142b may be configured to generate the signals QA, QB and Y_CLK.

In various embodiments, the circuit 74 may be enabled to automatically adjust a skew time of a plurality of output pins during a manufacturing test operation. In various embodiments, the circuit 74 may be enabled to adjust the skew time (e.g., tSkew) to within a single gate delay of a reference output clock. As used herein, the term tSkew may be defined as the phase difference between an output data signal or pin (e.g., Q) and an output clock signal or pin (e.g., Y_CLK). In an example, a DDR4 registered clock driver (RCD) may have sixty-six output pins. However, other numbers of output pins may be implemented to meet the design criteria of a particular implementation (e.g., a DDR5 implementation).

The circuit 74 may be configured to adjust the phase of the output pins relative to the clock signal Y_CLK (or to respective copies of the clock signal Y_CLK) to meet manufacturer specifications (e.g., within +/−50 ps, etc.). The granularity of the phase adjustment is generally determined by delay elements within the circuit 74. During production testing, the circuit 74 may be configured to perform a trimming process in response to signals from automated test equipment and provide a pass/fail indication to the automated test equipment. In various embodiments, the circuit 74 may be utilized to implement the RCD in DDR4 RDIMM, DDR4 LRDIMM, DDR4 UDIMM and/or DDR5 memory modules.

In some embodiments, the RCD circuit 74 may comprise the circuit 100. In some embodiments, the circuit 100 may be implemented wholly or partially within the circuit 140, the circuit 142a and/or the circuit 142b. In some embodiments, the RCD circuit 74 may implement multiple instances of the circuit 100 (e.g., one implemented within the circuit 142a and another implemented within the circuit 142b). In some embodiments, the circuit 100 may be implemented as a component separate from the other components of the RCD 74. The circuit 100 implemented within the RCD circuit 74 may be configured to implement an open loop architecture and/or digital calibration of a tPDM delay in a double data rate (DDR) memory system. Details of the circuit 100 may be described in association with FIGS. 5-14.

Figure 5:
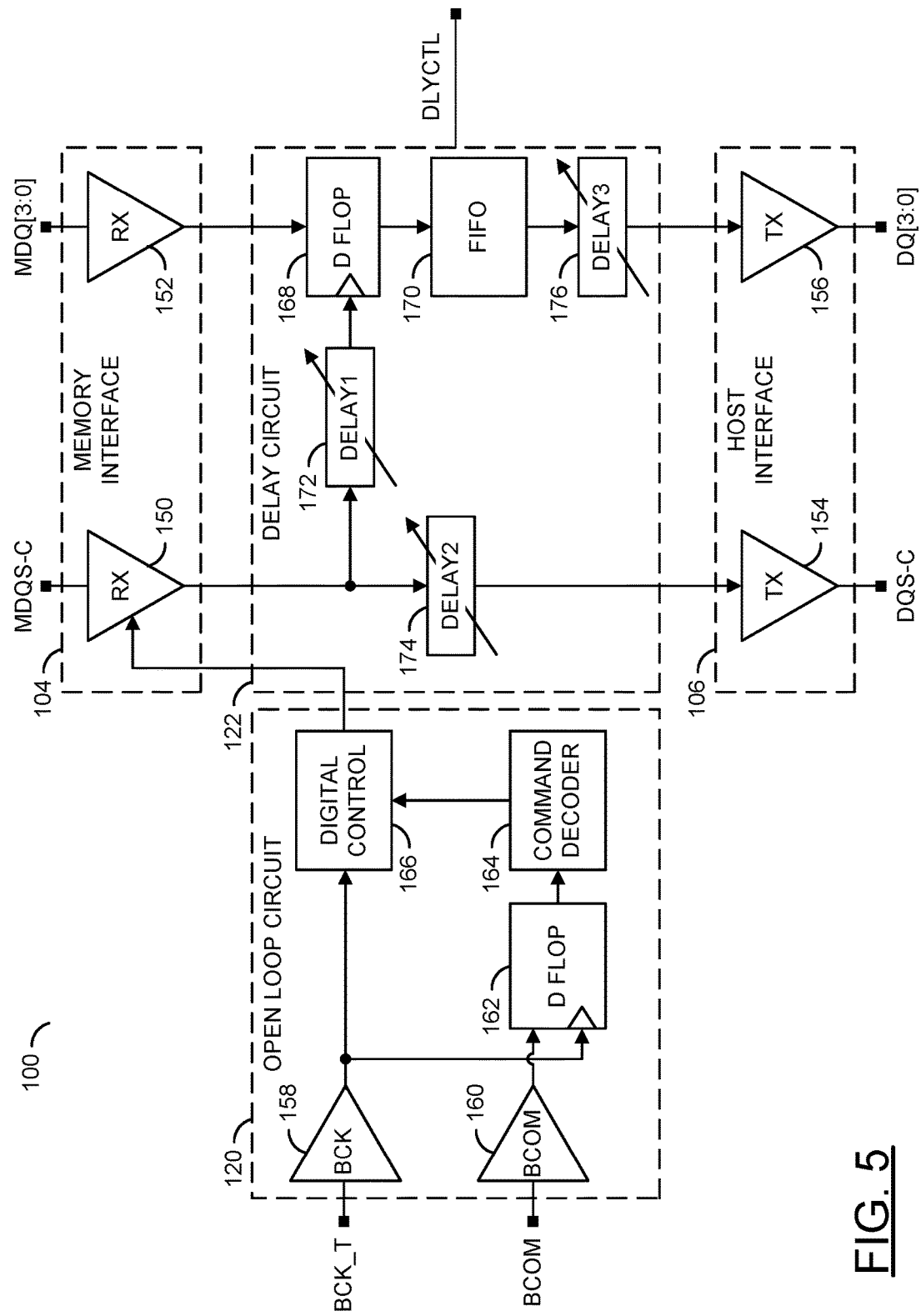
FIG. 5 is a block diagram illustrating an example embodiment of the present invention.

Referring to FIG. 5, a block diagram illustrating an example embodiment of the present invention is shown. Example components of the apparatus 100 are shown. The memory interface 104, the host interface 106, the open loop circuit 120 and/or the delay circuit 122 are shown. The apparatus 100 may comprise other components (e.g., the calibration circuit 108, not shown). The number, type and/or arrangement of components of the apparatus 100 may be varied according to the design criteria of a particular implementation.

Generally, signal training for the memory modules 50a-50n may be implemented to keep data strobe signals (e.g., DQS) and the data signals (e.g., DQ) in parallel. The apparatus 100 may be implemented without a large DLL and/or PLL circuit since the clock is aligned with the data. The apparatus 100 may implement an open loop architecture to keep the clock aligned with the data (e.g., similar to the source signal). The apparatus 100 may be configured to enable the input signals and output signals have the same delay time (e.g., 1.3 ns-1.6 ns according to the JEDEC specification). The apparatus 100 may be configured to delay the data signals to conform to the timing specification.

The apparatus 100 may be configured to replace a functionality of a DLL and/or PLL (e.g., locking the timing relationship and keeping tPDM constant) by implementing a delayline (e.g., the delayline circuit 102) with digital calibration. Since the memory modules 50a-50n implement many combinations of different clock phases, using a PLL combined with a phase blender and/or delay cells (e.g., to adjust the skew to correct the pin-to-pin variation due to the layout matching and/or process, voltage, temperature (PVT) variation) may impose bandwidth limitations (e.g., at 4.4 GHz, 6.6 GHz and greater). For example, with speed increases that may be specified in DDR5, the timing becomes so critical and bandwidth in PLL/DLL solutions may be a limitation (e.g., timing may be hard to close). In some embodiments, the apparatus 100 may be configured to operate at low frequencies and/or high frequencies (e.g., within a range of 0.5 GHz and 20 GHz). Controlling a delay using a PLL/DLL implementation may not be scalable. The apparatus 100 may implement a simplified circuit compared to the complicated PLL/DLL implementation. The open loop architecture implemented by the apparatus 100 may be scalable (e.g., from 28 nm to smaller process sizes). The open loop architecture implemented by the apparatus 100 may be configured to function outside of the bandwidth limitations imposed by a PLL/DLL solution.

The apparatus 100 may implement the open loop architecture with digital calibration in the DQ/DQS path (e.g., the data paths 80a-80n) to keep tPDM constant. The memory interfaces for DDR4 and/or DDR5 memory (e.g., the RCD 74 and/or the data buffers 70a-70n) may be a source synchronized data transportation between the host CPU 20 and the DRAM memory devices 72a-72n. The signal DQ may be the data and the signal DQS may be the clock from the host input (e.g., from the bus 30). The signal MDQ may be the data and the signal MDQS may be the clock from the DRAM (e.g., from the bus 58). The signals DQ, MDQ, DQS and/or MDQS may be bi-directional. In order to keep the timing relationship in accordance with the JEDEC specification, the apparatus 100 may keep the total delay (e.g., the tPDM) from DQ/DQS to MDQ/MDQS constant. For example, when the apparatus 100 is implemented in the RCD 74, a target delay tPDM may be approximately 1.2 ns. In another example, when the apparatus 100 is implemented in the data buffers 70a-70n the target delay tPDM may be approximately 1.5 ns. The tPDM may be marginally varied around the target values (e.g., a pre-defined range). In one example, the target values for the tPDM may be a range of approximately 1.3 ns-1.6 ns for the data buffers 70a-70n. In another example, the target values for the tPDM may be 0.1 ns to 10 ns. The target values may be varied according to the design criteria of a particular implementation.

The apparatus 100 may provide a solution to solve the complicated implementation, high power consumption and/or bandwidth limits imposed by a DLL/PLL circuit in DDR5 (or DDR4). The open loop architecture of the apparatus 100 may be fast compared to DLL/PLL solutions. The open loop architecture of the apparatus 100 may not accumulate jitter. In the source sync system, the data and clock may track each other. The design of the apparatus 100 may be portable to different processes (e.g., 28 nm and below) and/or data rates (e.g., if the JEDEC specification is updated). The apparatus 100 may consume low power and/or use a small amount of area.

The memory interface 104 may be configured to receive data from the DRAM devices 72a-72n. Generally, in an operational environment, data received from the DRAM devices 72a-72n is noisy. In the example shown, the memory interface 104 may receive a signal (e.g., MDQS-C) and the signals MDQ. The signal MDQS-C may represent a clean (e.g., ideal) version of the signal MDQS (e.g., no noise on the signal MDQS-C). The apparatus 100 shown in FIG. 5 may represent an idealized scenario where all the signals are clean as an illustrative example.

The memory interface 104 may comprise a block (or circuit) 150 and/or a block (or circuit) 152. The circuit 150 and/or the circuit 152 may implement an input buffer (or a number of input buffers). The input buffer 150 may receive the signal MDQS-C and/or a control signal and present the signal MDQS-C to the delay circuit 122. The input buffer 152 may receive the signal MDQ and present the signal MDQ to the delay circuit 122. The circuit 152 may implement a multi-bit input buffer (e.g., a 4-bit buffer). The memory interface 104 may comprise other components (not shown). The number, type and/or arrangement of components of the memory interface 104 may be varied according to the design criteria of a particular implementation.

The host interface 106 may be configured to receive a delayed version of the signal MDQS-C and/or a delayed version of the signal MDQ from the delay circuit 122. The host interface 106 may present a signal (e.g., DQS-C) and/or the signal DQ (e.g., to the host memory controller 20). The signal DQS-C may be a clean version of the signal DQS generated in response to the signal MDQS-C. Generally, the output of the host interface 106 to the host memory controller 20 is clean (e.g., a low and/or acceptable amount of noise). For example, data sent from the DRAM modules 72a-72n to the apparatus 100 may have a higher amount of noise than the data sent from the host interface 106 to the host memory controller 20.

The host interface 106 may comprise a block (or circuit) 154 and/or a block (or circuit) 156. The circuit 154 and/or the circuit 156 may implement an output buffer (or a number of output buffers). The output buffer 154 may receive a delayed version of the signal MDQS-C and present the signal DQS-C to the host interface 20. The output buffer 156 may receive the delayed version of the signal MDQ and present the signal DQ to the host memory interface 20. The circuit 156 may implement a multi-bit output buffer (e.g., a 4-bit buffer). The host interface 106 may comprise other components (not shown). The number, type and/or arrangement of components of the host interface 106 may be varied according to the design criteria of a particular implementation.

The open loop circuit 120 may be configured to receive the signal BCK_T and/or the signal BCOM. The circuit 120 may be configured to generate a control signal to control the input buffer 150 and/or the input buffer 152 of the memory interface 104. The signal BCK_T may be generated by the RCD 74 to provide a precise frequency. For example, the apparatus 100 may read the operating frequency from the RCD 74. The apparatus 100 may perform digital calibration to maintain the timing relationship (e.g., at approximately 4.4 GHz a nominal delay of 1.5 ns may be calibrated). For example, the apparatus 100 may perform digital calibration to maintain the timing relationship (e.g., the amount of delay) to correct for VDD drift and/or temperature drift.

The open loop circuit 120 may comprise a block (or circuit) 158, a block (or circuit) 160, a block (or circuit) 162, a block (or circuit) 164, and/or a block (or circuit) 166. The circuit 158 may implement an input buffer. The circuit 160 may implement an input buffer. The circuit 162 may implement a flip-flop circuit. The circuit 164 may implement a command decoder. The circuit 166 may implement a digital control circuit. The open loop circuit 120 may comprise other components (not shown). The number, type and/or arrangement of components implemented by the open loop circuit 120 may be varied according to the design criteria of a particular implementation.

The input buffer 158 may receive the signal BCK_T. The input buffer 160 may receive the signal BCOM. The signal BCK_T may be used as a clock reference (e.g., a system clock) to calibrate the tPDM delay with the respect to BCK_T cycles. The signal BCOM may provide commands.

The flip-flop 162 may be implemented as a D flip-flop circuit. The flip-flop 162 may be controlled by and/or pass data from the signal BCOM based on the signal BCK_T. For example, the signal BCK_T may be the clock input and the signal BCOM may be the D input for the D flip-flop 162. The command decoder 164 may be configured to decode the data in the signal BCOM. For example, the command decoder 164 may decode information to determine the timing for the apparatus 100. For example, the signal BCOM may comprise information about the cycle delay, the internal delay and/or define each time delay cycle. The digital control circuit 166 may be configured to control the bi-directional communication of the memory interface 104. For example, the digital control circuit 166 may enable the path for the memory interface 104 to be tri-state. For example, data from the digital control 166 may control the input buffer 150 and/or the input buffer 152. The timing control by the digital control 166 may enable bi-directional operation for the data buffers 70a-70n.

The delay circuit 122 may be configured to receive the signal MDQS-C (e.g., a strobe signal) and/or the signals MDQ (e.g., a data signal) from the memory interface 104. The delay circuit 122 may present a delayed version of the signal MDQS-C and/or the signals MDQ to the host interface 106. The delay circuit 122 may be configured to receive a signal (e.g., DLYCTL). The signal DLYCTL may be generated in response to the digital calibration performed by the calibration circuit 108. The signal DLYCTL may be used to calibrate the delay and/or delay cells of the apparatus 100 to make the total delay on both the MDQS and MDQ path to be approximately 1.3 ns to 1.5 ns without using a PLL/DLL. The digital calibration may enable the open loop solution while maintaining the timing relationship.

The delay circuit 122 may comprise a block (or circuit) 168, a block (or circuit) 170, a block (or circuit) 172, a block (or circuit) 174 and/or a block (or circuit) 176. The circuit 168 may implement a flip-flop circuit. The circuit 170 may implement a first-in first-out (FIFO) circuit. The circuit 172 may implement a variable delay circuit. The circuit 174 may implement a variable delay circuit. The circuit 176 may implement a variable delay circuit. The delay circuit 122 may comprise other components (not shown). The delay circuit 122 may comprise variable delay circuits, phase interpolators and/or phase blenders. The number, type and/or arrangement of components of the delay circuit 122 may be varied according to the design criteria of a particular implementation.

The flip-flop circuit 168 may be implemented as a D flip-flop. The flip-flop circuit 168 may receive the data signals MDQ from the memory interface 152 (e.g., as a D input of a D flip-flop). The flip-flop circuit 168 may receive an output from the variable delay circuit 172 (e.g., as the clock input of a D flip-flop). The FIFO 170 may receive an output from the flip-flop 170. The FIFO 170 may present the data signals MDQ to the variable delay circuit 176. The FIFO 170 may introduce an amount of delay (e.g., a FIFO_delay value) to the data signal MDQ.

The variable delay circuit 172, the variable delay circuit 174 and/or the variable delay circuit 176 may each be implemented as a delay circuit, a phase blender and/or a phase interpolator. The variable delay circuit 172, the variable delay circuit 174 and/or the variable delay circuit 176 may each be independently controlled to adjust an amount of delay. In one example, the signal DLYCTL generated by the calibration circuit 108 may be used to control the amount of delay implemented by one or more of the variable delay circuit 172, the variable delay circuit 174 and/or the variable delay circuit 176. The variable delay circuit 172, the variable delay circuit 174 and/or the variable delay circuit 176 may each be adjusted to control the delay tPDM through the delay circuit 122. For example, the variable delay circuit 172, the variable delay circuit 174 and/or the variable delay circuit 176 may be adjusted to keep the amount of delay for transmitting the signal MDQS-C and/or MDQ from the memory interface 104 to the host interface 106 constant (e.g., approximately 1.3 ns to 1.6 ns).

The variable delay circuit 172 may receive the signal MDQS-C from the memory interface 104. In one example, the signal MDQS-C may track (e.g., align with) the signal BCK_T. The variable delay circuit 172 may provide an input to the clock input of the D flip-flop 168. The variable delay circuit 172 may be configured to enable the strobe signal MDQS-C to sample data from the signal MDQ. The variable delay circuit 172 may be configured to align the timing of the signal MDQS-C with the signals MDQ. In an example, the variable delay circuit 172 may implement a delay amount Delay1.

The delay amount Delay1 may be configured to sample the data (e.g., using the flip-flop 168) at the center of the eye of the signal MDQ. Generally, the value of the delay amount Delay1 may be from 0 to one quarter of a clock cycle. In one example, when the data rate frequency for the signal MDQ is 2.2 GHZ, each cycle may be approximately 400 ps and the delay amount Delay1 may be approximately 100 ps (e.g., one quarter of a clock cycle).

The variable delay circuit 174 may receive the signal MDQS-C from the memory interface 104. In one example, the signal MDQS-C may track (e.g., align with) the signal BCK_T. The variable delay circuit 174 may be configured to generate a delayed version of the signal MDQS-C. The variable delay circuit 174 may be configured to provide the delayed version of the signal MDQS-C to the host interface 106 (e.g., the output buffer 154). The variable delay circuit 174 may be configured to align the timing of the signal MDQS-C with the signals MDQ and/or provide a constant delay tPDM. The digital calibration may be configured to adjust the amount of delay implemented by the variable delay circuit 174 according to an equation (e.g., EQ1):

$$\text{Delay2} = tPDM\_target - Tx - Rx \qquad (EQ1)$$

The value Delay2 may represent the amount of delay implemented by the variable delay circuit 174. The value tPDM_target may represent the amount of delay implemented by the apparatus 100 (e.g., approximately 1.5 ns). For example, the value tPDM_target may be defined by the system to be a constant value (e.g., a desired total amount of delay from input to output and/or the total latency within the chip). The value Tx may represent an amount of latency resulting from the output buffer 154. The value Rx may represent an amount of latency resulting from the input buffer 150.

The delay amount Delay2 may be determined using the equation EQ1. The delay amount Delay2 may be adjusted to generate the value tPDM_target. Generally, the value Tx–Rx may be within a range of approximately 300 ps-600 ps. The value Tx–Rx may vary based on the process (e.g., PVT variation). In one example, when the value tPDM_target is 1.5 ns, then the delay amount Delay2 may be approximately 0.9 ns-1.2 ns.

The variable delay circuit 176 may receive the signals MDQ from the FIFO 170'. The variable delay circuit 176 may be configured to generate a delayed version of the signal MDQ. The variable delay circuit 176 may be configured to provide the delayed version of the signal MDQ to the host interface 106 (e.g., the output buffer 156). The variable delay circuit 176 may be configured to align the timing of the signal MDQS-C with the signals MDQ and/or provide a constant delay tPDM. The digital calibration may be configured to adjust the amount of delay implemented by the variable delay circuit 176 according to an equation (e.g., EQ2):

$$\text{Delay3} = t\text{PDM\_target} - Tx - Rx - \text{Delay1} - \text{FIFO\_delay} \quad (EQ2)$$

The value Delay3 may represent the amount of delay implemented by the variable delay circuit 176. The value tPDM_target may represent the amount of delay implemented by the apparatus 100 (e.g., approximately 1.5 ns). For example, the value tPDM_target may be the same value used in the equation EQ1. The value Tx may represent an amount of latency resulting from the output buffer 156. The value Rx may represent an amount of latency resulting from the input buffer 152. The value Delay1 may be the amount of delay generated by the variable delay circuit 172 (e.g., used to control the flip-flop 168). The value FIFO_delay may be the amount of latency resulting from the FIFO circuit 170.

The delay amount Delay3 may be determined using the equation EQ2. The delay amount Delay3 may be adjusted to generate the value tPDM_target. Generally, the value Tx−Rx may be within a range of approximately 300 ps-600 ps. The value Tx−Rx may vary based on the process (e.g., PVT variation). The value Delay1 may be approximately a quarter clock cycle of the signal MDQ (e.g., to sample the data at the center of the eye). The value FIFO_delay may be variable.

The example apparatus 100 shown may provide a constant tPDM when the signal BCK_T and/or the signal MDQS-C each are clean. The delayline circuit 102 may be used with the digital calibration performed by the calibration circuit 108 to keep the constant tPDM. The apparatus 100 may be configured to calibrate the variable delay circuit 172, the variable delay circuit 174 and/or the variable delay circuit 176 to make the total delay on both the MDQS path and the MDQ path to be the desired value (e.g., approximately 1.5 ns). The example apparatus 100 may implement a purely open loop architecture. For example, the example apparatus 100 may represent an ideal model. Generally, the strobe signal MDQS from the DRAM modules 72a-72n has a significant amount of noise (e.g., not a clean signal). Details of the apparatus 100 for implementing the open loop architecture with digital calibration to generate a constant tPDM value when the signals are not clean may be described in association with FIG. 6.

Figure 6:
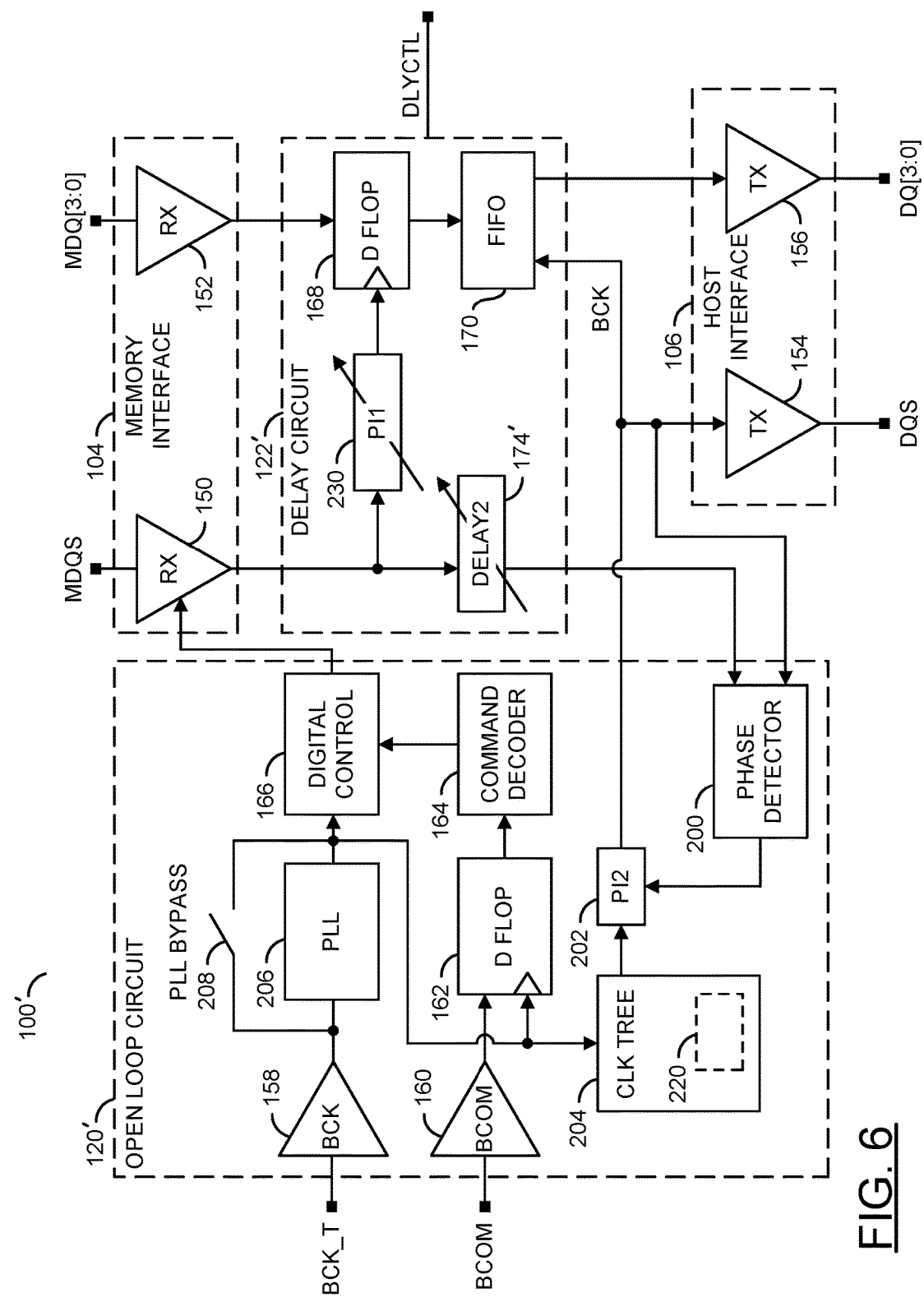
FIG. 6 is a block diagram illustrating an example of an open loop architecture.

Referring to FIG. 6, a block diagram illustrating an example of an open loop architecture for the circuit 100' is shown. Example components of the apparatus 100' are shown. The memory interface 104, the host interface 106, the open loop circuit 120' and/or the delay circuit 122' are shown. The apparatus 100' may comprise other components (e.g., the calibration circuit 108, not shown). The number, type and/or arrangement of components of the apparatus 100' may be varied according to the design criteria of a particular implementation.

The memory interface 104 may be configured to receive data from the DRAM devices 72a-72n. Generally, in an operational environment, data received from the DRAM devices 72a-72n is noisy. In the example shown, the memory interface 104 may receive the noisy signal MDQS and the signals MDQ. Since the signals from the DRAM devices 72a-72n may be jittery, the signal MDQS may not be suitable to fetch and/or send data out. For example, at a high frequency, the signal MDQS may not be suitable and/or reliable to sample the data signals MDQ for transmission to the host memory controller 20. The apparatus 100' may be configured to swap the clocks for output to the host interface 106. For example, the apparatus 100' may swap the output clock to the signal BCK_T instead of the signal MDQS. The apparatus 100' may be configured to use the signal BCK_T to sample the data from the data signal MDQ and/or send the signal BCK_T to the output buffer 154 of the host interface 106 to be used as the strobe signal DQS.

The memory interface 104 may comprise the input buffer 150 and/or the input buffer 152. The memory interface 104 may be configured to receive the (noisy) strobe signal MDQS and/or the data signals MDQ. The host interface 106 may comprise the output buffer 154 and/or the output buffer 156. The host interface 106 may be configured to receive a signal (e.g., BCK) that has been aligned to the strobe signal MDQS and/or a delayed version of the signal MDQ.

The open loop circuit 120' may be configured to receive the signal BCK_T, the signal BOOM, a signal (e.g., BCK) and/or a delayed version of the signal MDQS. The open loop circuit 120' may be configured to present the signal BCK and/or the digital control signal. The open loop circuit 120' may comprise the input buffer 158, the input buffer 160, the flip-flop 162, the command decoder 164, the digital control circuit 166, a block (or circuit) 200, a block (or circuit) 202, a block (or circuit) 204, a block (or circuit) 206 and/or a switch 208. The circuit 200 may implement a phase detector. The circuit 202 may implement a phase interpolator. In some embodiments, the circuit 202 may implement a variable delay circuit and/or a phase blender. The block 204 may implement a clock tree. The circuit 206 may implement a PLL circuit. The open loop circuit 120' may comprise other components (not shown). The number, type and/or arrangement of the components of the circuit 120' may be varied according to the design criteria of a particular implementation.

The phase detector 200 may be configured to align the signal BCK_T to the strobe signal MDQS. The phase detector 200 may receive a delayed version of the signal MDQS from the variable delay circuit 174' (e.g., the delay circuit, the phase blender and/or phase interpolator). The phase detector 200 may receive the signal BCK as feedback from the phase interpolator 202. The signal BCK may be an interpolated version of the signal BCK_T. The phase detector 200 may be configured to generate an output once the signal BCK (e.g., derived from the signal BCK_T) and the delayed version of the signal MDQS are in zero phase. Once the signal BCK (e.g., the signal BCK_T) and the delayed version of the signal MDQS are in zero phase, the signal BCK may be used to sample the data signal MDQ and send out the data from the DRAM modules 72a-72n with reduced jitter.

The phase interpolator 202 may be configured to receive the signal BCK_T from the clock tree 204 and the output from the phase detector 200. The phase interpolator 202 may be configured to generate the signal BCK. For example, the signal BCK may be an in-phase version of the system clock BCK_T. The phase interpolator 202 may be calibrated. In an example, the phase interpolator 202 may be calibrated using the signal DLYCTL generated by the calibration circuit 108. The phase interpolator 202 may be calibrated to generate the same phase for the signal BCK and the signal DQS. For example, the phase interpolator 202 may generate the signal BCK in response to the calibration and the signal BCK_T. The phase interpolator 202 may present the signal BCK to the FIFO circuit 170', to the host interface 106 (e.g., the output buffer 154) and/or as feedback to the phase detector 200.

The phase interpolator 202 may have a variable delay amount (e.g., PI2). The variable delay amount PI2 may be adjusted to generate a zero phase relationship between the signal BCK and the delayed version of the signal MDQS. For example, the variable delay amount PI2 may be adjusted to any degree value to align the clocks until the zero phase is achieved. When the zero phase is reached, the phase may be locked to implement the clock replacement. For example, the phase detector 200 may be configured to use the clock signal BCK and add the phase to align the clock signal BCK with the signal MDQS. When the clock signal BCK is aligned, the signal BCK may be used to sample the transmitted data signal MDQ. The variable delay amount PI2 may be tuned until the phase is matched. The clock replacement using the signal BCK may not be implemented until the phase is matched.

The clock tree 204 may receive the signal BCK_T. The clock tree 204 may comprise a complex network of traces and/or connections. The clock tree 204 may cause a mismatch between the timings of the transmission of various bits of data. The block tree 204 may be configured to present the signal BCK_T to various components. In the example shown, the clock tree 204 may present the signal BCK_T to the phase interpolator 202. Generally, the clock tree 204 may be configured to transmit the signal BCK_T to various components of the apparatus 100. The clock tree 204 may be configured to provide constant values to the components of the apparatus 100 (e.g., facilitate a transfer of signals from one location to another location to deliver to multiple flip-flops and/or data paths and provide a close to perfect match as possible). The clock tree 204 may comprise a block (or circuit) 220. The circuit 220 may be configured to compensate for a voltage drift (e.g., PVT variation) in the clock tree 204 (e.g., keep a constant low dropout (LDO) voltage for the clock tree 204). Details of the circuit 220 may be described in more detail in association with FIG. 9.

The PLL 206 may be configured to receive the signal BCK_T from the input buffer 158. The PLL 206 may present the signal BCK_T to the digital control circuit 166, a clock input of the flip-flop 162 and/or the clock tree 204. The PLL 206 may be configured to clean the signal BCK_T (e.g., reduce jitter). Generally, the PLL 206 may not be implemented to perform a lock. The PLL 206 may be configured to clean up the system. For example, the PLL 206 may be implemented as a low power PLL to make the system more robust. The PLL 206 may be a small, low-powered device (e.g., compared to a PLL used to perform a locking operation).

The switch 208 may implement a PLL bypass. In one example, if the signal BCK_T is clean, the PLL 206 may be bypassed using the switch 208. Bypassing the PLL 206 may implement a pure open loop architecture. Implementing the PLL 206 may implement an open loop architecture since there is no loop from all the signals to the PLL 206.

The delay circuit 122' may be configured to respond to the digital calibration to keep the tPDM constant. The delay circuit 122' may be configured to receive the signal MDQS and/or MDQ from the memory interface 104, the signal DLYCTL from the calibration circuit 108 and/or the signal BCK from the open loop circuit 120'. The delay circuit 122' may be configured to present the delayed version of the signal MDQS and/or the delayed version of the signal MDQ. The delay circuit 122' may comprise the flip-flop 168, the FIFO circuit 170', the variable delay circuit 174' and/or a block (or circuit) 230. The circuit 230 may implement a phase interpolator. In some embodiments, the circuit 230 may implement a variable delay circuit and/or a phase blender. The delay circuit 122' may comprise other components (not shown). The number, type and/or arrangement of the components of the delay circuit 122' may be varied according to the design criteria of a particular implementation.

The phase interpolator 230 may be configured to receive the signal MDQS from the memory interface 104 (e.g., the input buffer 150). The phase interpolator 230 may generate a clock signal input for the flip-flop 168. For example, the phase interpolator 230 may be configured to control a timing of the flip-flop 168. The phase interpolator 230 may be calibrated. In an example, the phase interpolator 230 may be calibrated using the signal DLYCTL generated by the calibration circuit 108. The phase interpolator 230 may be calibrated to center the eye for the data signal DQ. For example, the phase interpolator 230 may generate the clock signal for the flip-flop 168 in response to the calibration and the signal MDQS. The phase interpolator 230 may have a variable delay amount (e.g., PI1). The variable delay amount PI1 may have a similar implementation as the signal Delay1 (e.g., from 0 to one quarter of a clock cycle to perform a sampling at the center of the eye of the signal MDQ).

The variable delay circuit 174' may be configured to make the total delay on both the path used by the signal MDQS and the path used by the signal MDQ to be the target tPDM value (e.g., a constant value of approximately 1.5 ns). The variable delay circuit 174' may generate the delayed version of the signal MDQS in response to the digital calibration and/or the noisy strobe signal MDQS. The delayed version of the signal MDQS may be presented to the phase detector 200. The delay amount implemented by the delay circuit 174' may be calculated according to an equation (e.g., EQ3):

$$\text{Delay2} = tPDM\_target - Tx - Rx - \alpha * PI2 - \beta * PI1 \quad \text{(EQ3)}$$

The value Delay2 may represent the amount of delay implemented by the variable delay circuit 174'. The value tPDM_target may represent the amount of delay implemented by the apparatus 100' (e.g., approximately 1.5 ns). For example, the value tPDM_target may be defined by the system to be a constant value (e.g., a desired total amount of delay from input to output and/or the total latency within the chip). The value Tx may represent an amount of latency resulting from the output buffer 154. The value Rx may represent an amount of latency resulting from the input buffer 150. The value PI2 may be an amount of delay of the phase interpolator 202. The value PI2 may be multiplied by a coefficient α (e.g., defined by the digital calibration). The value PI1 may be an amount of delay of the phase interpolator 230. The value PI1 may be multiplied by a coefficient β (e.g., defined by the digital calibration).

The coefficient α and/or the coefficient β may be selected values. In one example, the coefficient α and/or the coefficient β may be varied between a range of 0-1/64. In some embodiments, (e.g., a hybrid solution) the value range for the coefficient α and/or the coefficient β may be 0-1/128. However, a range of 0-1/128 may consume more power and/or use more area. Generally, for DDR4 and/or DDR5 applications, the range of the coefficient α and/or the coefficient β may be 0-1/64.

The flip-flop 168 may receive the signals MDQ from the memory interface. The flip-flop 168 may comprise a multi-bit circuit. The flip-flop 168 may present the signal MDQ to the FIFO circuit 170'. The FIFO circuit 170' may be implemented due to the large jitter from the DRAM modules 72a-72n. The FIFO circuit 170' may be configured to clean up the clock jitter and/or to introduce delay (e.g., retiming). In an example, using the signal BCK may reduce the amount of jitter on the signals MDQ by ¼ with respect to the signal MDQS. The FIFO circuit 170' may be configured to present a clean (e.g., reduced jitter) and/or delayed version of the data signals MDQ to the host interface 106.

Figure 7:
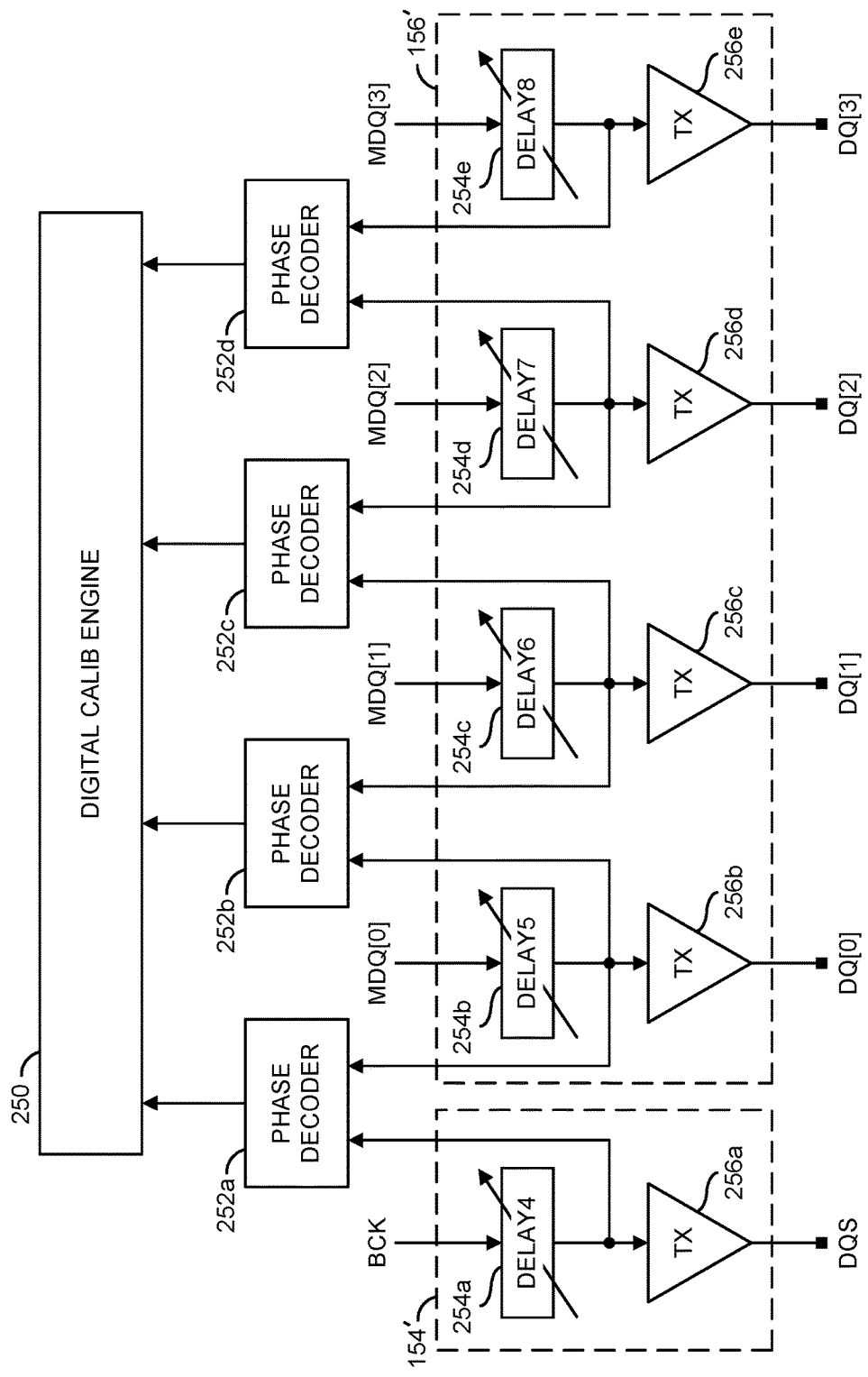
FIG. 7 is a block diagram illustrating an output skew digital calibration for a host interface.

Referring to FIG. 7, a block diagram illustrating an output skew digital calibration for the host interface 106' is shown. The host interface 106' may be configured to receive the signal BCK (e.g., from the open loop circuit 120') and/or the signals MDQ (e.g., from the delay circuit 122'). In the example shown the data signals MDQ may be a four-bit signal (e.g., comprising a signal MDQ[0], a signal MDQ[1], a signal MDQ[2] and/or a signal MDQ[3]). The host interface 106' may be configured to present the signal DQS and/or the signals DQ. In the example shown, the data signals DQ may be a four-bit signal (e.g., comprising a signal DQ[0], a signal DQ[1], a signal DQ[2] and/or a signal DQ[3]).

The host interface 106' may comprise the output buffer 154', the output buffer 156', a block (or circuit) 250 and/or blocks (or circuits) 252a-252d. The circuit 250 may implement a digital calibration engine. The circuits 252a-252d may comprise phase decoders. The host interface 106' may comprise other components (not shown). The number, type and/or arrangement of the components of the host interface 106' may be varied according to the design criteria of a particular implementation.

The output buffer 154' may comprise a block (or circuit) 254a and/or a block (or circuit) 256a. The circuit 254a may implement a fine tune delay circuit. The circuit 256a may implement a buffer. The fine tune delay circuit 254a may receive the signal BCK. The fine tune delay circuit 254a may present a delayed version of the signal BCK to the buffer 256a. The fine tune delay circuit 254a may have a variable delay value (e.g., Delay4). The buffer 256a may present the signal DQS.

The output buffer 156' may comprise blocks (or circuits) 254b-254e and/or blocks (or circuits) 256b-256e. The circuits 254b-254e may each implement a fine tune delay circuit. The circuits 256b-256e may each implement a buffer. The fine tune delay circuits 254b-254e may each receive a respective portion of the signal MDQ. Each of the fine tune delay circuits 254b-254e may present a portion of the delayed version of the signal MDQ to a respective one of the buffers 256b-256e. Each of the buffer 256b-256e may present a respective portion of the signal DQS. For example, the fine tune delay circuit 254b may receive the signal MDQ[0], present a delayed version of the signal MDQ[0] to the buffer 256b and the buffer 256b may present the signal DQ[0]. The fine tune delay circuit 254b may have a variable delay value (e.g., Delay5). The fine tune delay circuit 254c may have a variable delay value (e.g., Delay6). The fine tune delay circuit 254d may have a variable delay value (e.g., Delay7). The fine tune delay circuit 254e may have a variable delay value (e.g., Delay8).

The fine tune delay circuits 254a-254e may present one or more outputs to the phase decoders 252a-252d. The fine tune delay circuit 254a may present an output to the phase decoder 252a. The fine tune delay circuit 254b may present an output to the phase decoder 252a and/or the phase decoder 252b. The fine tune delay circuit 254c may present an output to the phase decoder 252b and/or the phase decoder 252c. The fine tune delay circuit 254d may present an output to the phase decoder 252c and/or the phase decoder 252d. The fine tune delay circuit 254e may present an output to the phase decoder 252d.

In the example shown, each of the phase decoders 252a-252d may be configured to receive one input signal from two associated fine tune delay circuits 254a-254e. Each of the phase decoders 252a-252d may present an output signal to the digital calibration engine 250. The phase decoders 252a-252d may be configured to compare a phase of one of the signals MDQ to another one of the signals MDQ (or the signal BCK).

In one example, the phase decoder 252a may generate an output signal for the digital calibration engine 250 in response to a comparison of a phase of the signal BCK delayed by the fine tune delay circuit 254a with the signal MDQ[0] delayed by the fine tune delay circuit 254b. In another example, the phase decoder 252b may generate an output signal for the digital calibration engine 250 in response to a comparison of a phase of the signal MDQ[0] delayed by the fine tune delay circuit 254b with the signal MDQ[1] delayed by the fine tune delay circuit 254c. In yet another example, the phase decoder 252c may generate an output signal for the digital calibration engine 250 in response to a comparison of a phase of the signal MDQ[1] delayed by the fine tune delay circuit 254c with the signal MDQ[2] delayed by the fine tune delay circuit 254d. In still another example, the phase decoder 252d may generate an output for the digital calibration engine 250 in response to a comparison of a phase of the signal MDQ [2] delayed by the fine tune delay circuit 254d with the signal MDQ[3] delayed by the fine tune delay circuit 254e.

The digital calibration engine 250 may be configured to perform a calibration in response to an amount of skew. For example, the output of the phase decoders 252a-252d may be used by the digital calibration engine 250 to determine the amount of skew of the signal BCK and/or the signals MDQ. The digital calibration engine 250 may perform the digital calibration to determine the amount of delay for the fine tune delay circuits 254a-254e (e.g., the delay amounts Delay4, Delay5, Delay6, Delay7 and/or Delay8). The digital calibration performed by the digital calibration engine 250 may be configured to make the skew aligned on both the MDQS path and the MDQ path. The digital calibration engine 250 may configure a fine tune calibration.

Generally, the DRAM modules 72a-72n may present signals with skew. For example, there may be skew between the 4 bits of the data path signal MDQ. If the 4 bits have misalignment, then digital calibration may be performed. As DRAM speeds increase, the amount of skew that may be acceptable becomes more compact. For example, the JEDEC specification may allow a skew of 5 ps-10 ps. Process variation may increase a difficulty of aligning the skew. The apparatus 100 may implement the fine tune delay cells 254a-254e for each tree to enable a calibration for achieving a perfect line (e.g., reducing skew to an acceptable amount). Implementing the digital calibration engine 250, the phase decoders 252a-252d, the fine tune delay circuits 254a-254e and/or the output buffers 256a-256e may replace solutions that implement PLL/DLL circuits. For example, the host interface 106' may implement an open loop architecture with digital calibration that achieves at least the performance of PLL/DLL solutions.

PLL/DLL solutions may be used internally for phase alignment (e.g., to lock all the signals). Using PLL/DLL solutions may cause problems (e.g., high power consumption, bandwidth limitations, lack of portability, difficulty scaling down to smaller processes, etc.). The apparatus 100 may be configured to replace PLL/DLL solutions with an open loop architecture and/or digital calibration. The digital calibration may be used to align the signals and/or reduce noise/jitter. For example, signals from the DRAM modules 72a-72n may have a lot of noise. The apparatus 100 may be implemented in the data buffers 70a-70n and/or in the RCD 74. For example, a DLL solution in the RCD 74 may have a large loop back, and the apparatus 100 may eliminate the loop back. The RCD 74 may be more sensitive to skew than the data buffers 70a-70n.

Figure 8:
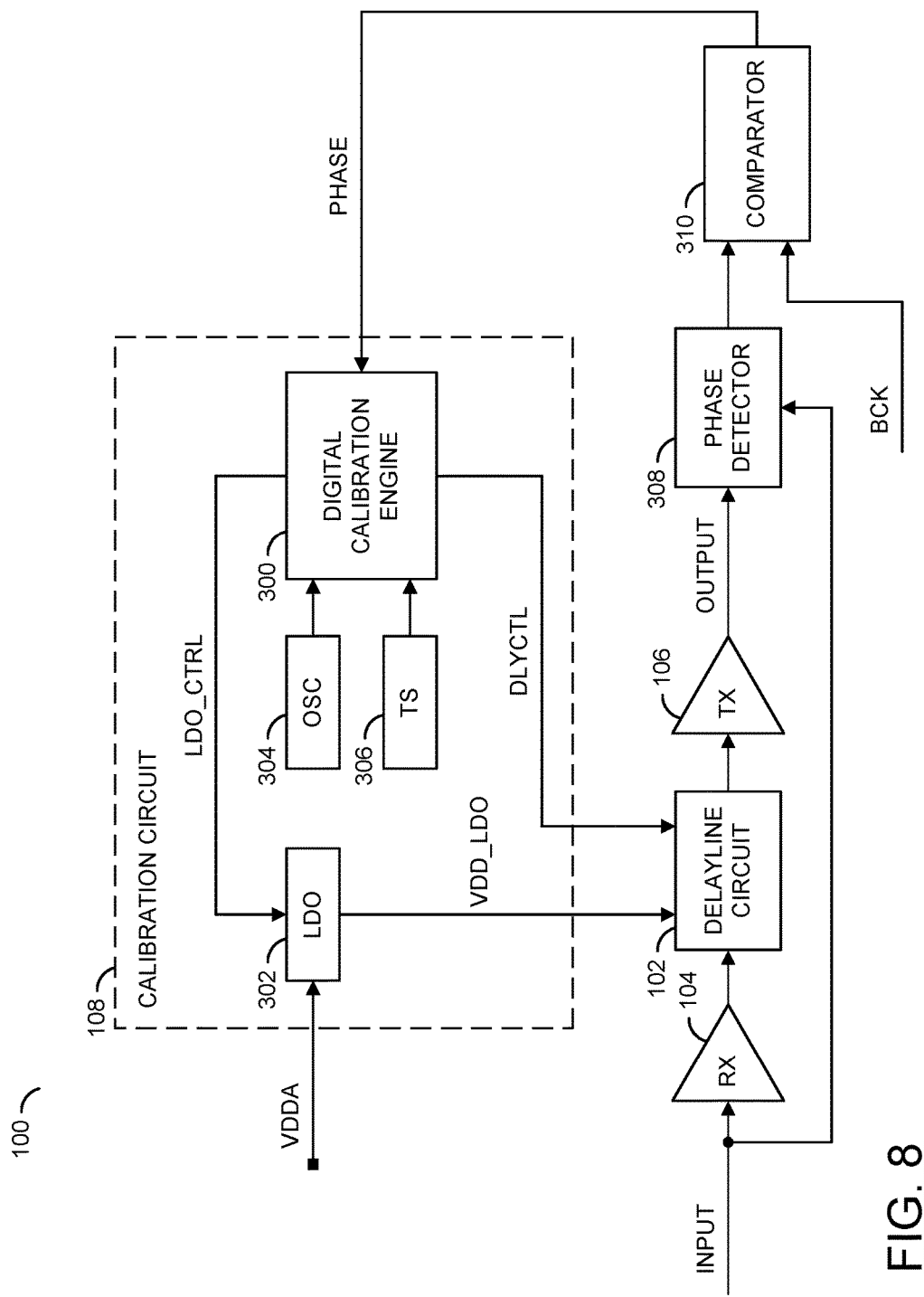
FIG. 8 is a block diagram illustrating a digital calibration circuit.

Referring to FIG. 8, a block diagram illustrating the digital calibration circuit 108 is shown. The calibration circuit 108 may be configured to perform the digital calibration for the components of the delayline circuit 102. The calibration circuit 108 is shown connected to the delayline circuit 102.

The calibration circuit 108 may be configured to receive an input (e.g., VDDA) from the system (e.g., one of the components of the memory modules 50a-50n) and/or an input (e.g., PHASE). The calibration circuit 108 may be configured to present the signal DLYCTL and/or present a signal (e.g., VDD_LDO) to the delayline circuit 102. The signal VDD_LDO may be configured to compensate for a voltage drift (e.g., a VDD drift).

The calibration circuit 108 may comprise a block (or circuit) 300, a block (or circuit) 302, a block (or circuit) 304 and/or a block (or circuit) 306. The circuit 300 may implement a digital calibration engine. The circuit 302 may implement a low dropout (LDO) regulator. The circuit 304 may implement an oscillator. The circuit 306 may implement a temperature sensor. The calibration circuit 108 may comprise other components (not shown). The number, type and/or arrangement of the components of the calibration circuit may be varied according to the design criteria of a particular implementation.

The digital calibration engine 300 may be configured to perform the digital calibration for the components of the delayline circuit 102. The digital calibration engine 300 may receive the signal PHASE. The digital calibration engine 300 may receive an input from the oscillator 304 and/or the temperature sensor 306. The input from the oscillator 304 and/or the temperature sensor 306 may provide information about the PVT characteristics of the memory module (e.g., one of the memory modules 50a-50n). The input signal PHASE may provide information about the phase of the output to the host memory controller 20 compared to the reference clock BCK. The digital calibration engine 300 may perform the digital calibration in response to the signal PHASE and/or the input from the oscillator 304 and/or the temperature sensor 306. The digital calibration performed by the digital calibration engine 300 may be configured to cause the delayline circuit 102 to produce a constant delay (e.g., a tPDM of approximately 1.3 ns-1.6 ns). The digital calibration engine 300 may present a signal (e.g., LDO_CTRL) and/or the signal DLYCTL.

The LDO 302 may receive the signal VDDA and/or the signal LDO_CTRL. The signal VDDA may be a VDD voltage in the analog power domain. The LDO 302 may generate the signal VDD_LDO in response to the signal VDDA and/or the signal LDO_CTRL. The signal LDO_CTRL may be configured to compensate for a voltage drift on the signal VDDA. The signal VDD_LDO may be presented to the delayline circuit 102 to control the voltage drift. The LDO 302 may regulate the system voltage VDDA in response to the signal LDO_CTRL generated by the digital calibration engine 300. The signal VDD_LDO may control the input voltage for the components of the delayline circuit 102.

The oscillator 304 may read the frequency of the system. In an example, the oscillator 304 may be a ring oscillator. The temperature sensor 306 may read the temperature of the system. The oscillator 304 and/or the temperature sensor 306 may provide PVT information to the digital calibration engine 300. In an example, the oscillator 304 and/or the temperature sensor 306 may be implemented to enable monitoring of information to determine an amount of voltage drift and/or process variation so that the digital calibration engine 300 may provide the appropriate tuning to maintain the constant output voltage.

The memory interface 104 may receive an input (e.g., the signal MDQS and/or the signal MDQ). The memory interface 104 may present the signals to the delayline circuit 102 (e.g., the open loop circuit 120 and/or the delay circuit 122). The delayline circuit 102 may present an output (e.g., the signal BCK and/or the delayed version of the data signals MDQ) to the host interface 106. The output may be presented to the host memory controller 20.

The memory interface 104 and/or the host interface 106 may further be connected to a block (or circuit) 308 and/or a block (or circuit) 310. The circuit 308 may implement a phase detector. The circuit 310 may implement a comparator. The input signal(s) to the memory interface 104 may be presented to the phase detector 308. The output signal(s) from the host interface 106 may be presented to the phase detector 308. The phase detector 308 may present an output to the comparator 310.

The comparator 310 may receive the output signal from the phase detector 308. The comparator 310 may receive the signal BCK. The signal BCK may be a reference clock. The comparator may generate the signal PHASE.

In some embodiments, the waveform out of the phase detector 308 may be an oscillating square waveform. The comparator 310 may compare the waveform from the phase detector 308 to the reference clock BCK. In one example, the comparator 310 may determine whether the output of the phase detector 308 has a pulse width of approximately 6.5 cycles of the reference clock BCK (e.g., 6.5 clock cycles may be approximately 1.475 ns when the reference clock operates at approximately 4.4 GHz). Generally, the reference clock BCK may be read from a register (e.g., a fine granularity register defined by the JEDEC specification). By comparing the input to the memory interface 104 and the output from the host interface 106, the delay may be kept constant. In one example, the delay may be a variable amount between approximately 1.3 ns and 1.6 ns. In another example, the delay may be less than 1.3 ns and/or greater than 1.6 ns (e.g., a range of 0.5 ns to 3 ns). The amount of delay may be varied according to the design criteria of a particular implementation.

The digital calibration may be implemented using the digital calibration engine 300, phase detector 308, the comparator 310, the delayline circuit 102 and/or the delay line cells 254a-254e with Tx/Rx replicators in the memory interface 104 and/or the host interface 106 (e.g., which may represent input Rx and output Tx). In an example, the total delay may be calibrated to approximately 1.475 ns with 6.5 cycles of BCK at 4400 MHz. The cycle may be varied by different BCK clock frequencies. The total delay may include Tx and Rx of the memory interface 104 and/or the host interface 106. The digital calibration engine 300 may read the output signal PHASE of the comparator 310 and control the delayline circuit 102 (e.g., using the signals DLYCTRL and/or VDD_LDO) until the total delay pulse width matches 6.5 clock cycles of the signal BCK. The digital calibration engine 300 may also read the oscillator 304 and/or the temperature sensor 306 to compensate the PVT variation.

Figure 9:
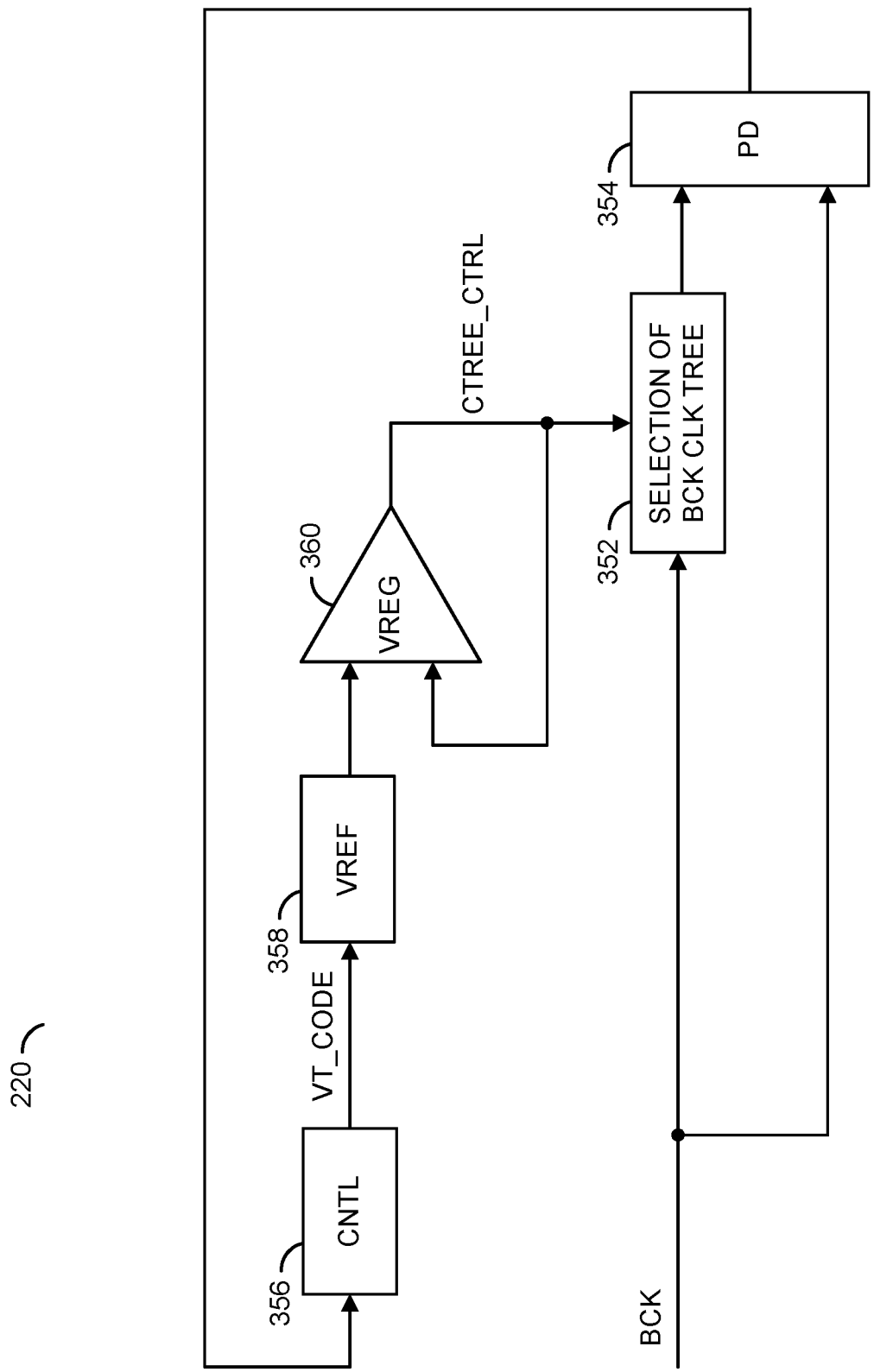
FIG. 9 is a block diagram illustrating a PVT monitor.

Referring to FIG. 9, a block diagram illustrating an example PVT monitor 220 is shown. The PVT monitor 220 may be configured to compensate for variations caused by the BCK clock tree. The PVT monitor 220 may comprise a block (or circuit) 352, a block (or circuit) 354, a block (or circuit) 356, a block (or circuit) 358 and/or a block (or circuit) 360. The circuit 352 may represent a selection of the BCK clock tree (e.g., a portion of the clock tree 204 shown in association with FIG. 6). The circuit 354 may implement a control circuit. The circuit 358 may implement a reference voltage circuit. The circuit 360 may implement a voltage regulator. The PVT monitor 220 may comprise other components (not shown). The number, type and/or arrangement of the components of the PVT monitor 220 may be varied according to the design criteria of a particular implementation.

The reference clock signal BCK may be transmitted to the selection of the clock tree 352 and one input of the phase detector 354. Generally, the delay of the selection of the clock tree 352 is constant over a particular PVT. The selection of the clock tree 352 may present an output to the phase detector 354. The output of the selection of the BCK clock tree 352 to the phase detector 354 may be generated in response to the voltage regulator 360.

The PVT monitor 220 may be configured to monitor and/or control the clock tree 204 to ensure the clock signal BLK is constant throughout the clock tree 204. An output from the selection of the BCK clock tree 352 may be provided to the phase detector 354. The phase detector 354 may compare the output from the selection of the BCK clock tree 352 with the signal BCK. The selection of the BCK clock tree 352 may be implemented to provide duplicated samples from the clock tree 204 (e.g., the actual clock tree). By sampling the delay from the selection of the BCK clock tree 352, the PVT monitor 220 may provide adjustments to lock the period of the delayed signals through the clock tree 352 with the signal BCK.

The phase detector 354 may present an output to the control circuit 356. The control circuit 356 may be configured to generate an output signal (e.g., VT_CODE). The signal VT_CODE may be presented to the reference voltage circuit 358. The signal VT_CODE may provide tuning (e.g., a PVT code) for the reference voltage circuit 358. The reference voltage circuit 358 may present the reference voltage to the voltage regulator 360 based on the signal VT_CODE. The voltage regulator 360 may present a signal (e.g., CTREE_CTRL) to the selection of the clock tree 352. The signal CTREE_CTRL may be distributed to LDO regulators to supply power to the actual clock tree 204.

The reference voltage generated by the reference voltage circuit 358 may be part of a feedback loop. The reference voltage (and the signal CTREE_CTRL) may be generated to keep the two voltage inputs (e.g., the signal BCK and the output from the selection of the BCK clock tree 352) to the phase detector 354 the same. In one example, when the phase detector 354 detects a voltage drift, the control circuit 356 may generate the signal VT_CODE to bring the voltage up and tune the voltage regulator 360 to bring the value of the signal CTREE_CTRL up. In another example, when the phase detector 354 detects a voltage drift, the control circuit 356 may generate the signal VT_CODE to bring the voltage down and tune the voltage regulator 360 to bring the value of the signal CTREE_CTRL down. The value of the signal VT_CODE, the reference voltage generated by the reference voltage circuit 358 and the signal CTREE_CTRL generated by the voltage regulator 360 may track each other. When the phase drift is detected by the phase detector 354, the control circuit 356 may tune the signal VT_CODE to control the reference voltage in a linear relationship to maintain a constant clocking.

The delay through the actual clock tree 204 may be a function of a power supplied to the clock tree 204. The PVT monitor may provide a feedback loop to determine information for keeping the delay of the selection of the BCK clock tree 352 constant. The relationship between the delay of the selection of the BCK clock tree 352 and the delay of the actual clock tree 204 may be a ratio. For example, the signal CTREE_CTRL from the voltage regulator 360 (e.g., determined by the PVT monitor 220) may be used to keep the delay of the actual clock tree 204 constant.

Figure 10:
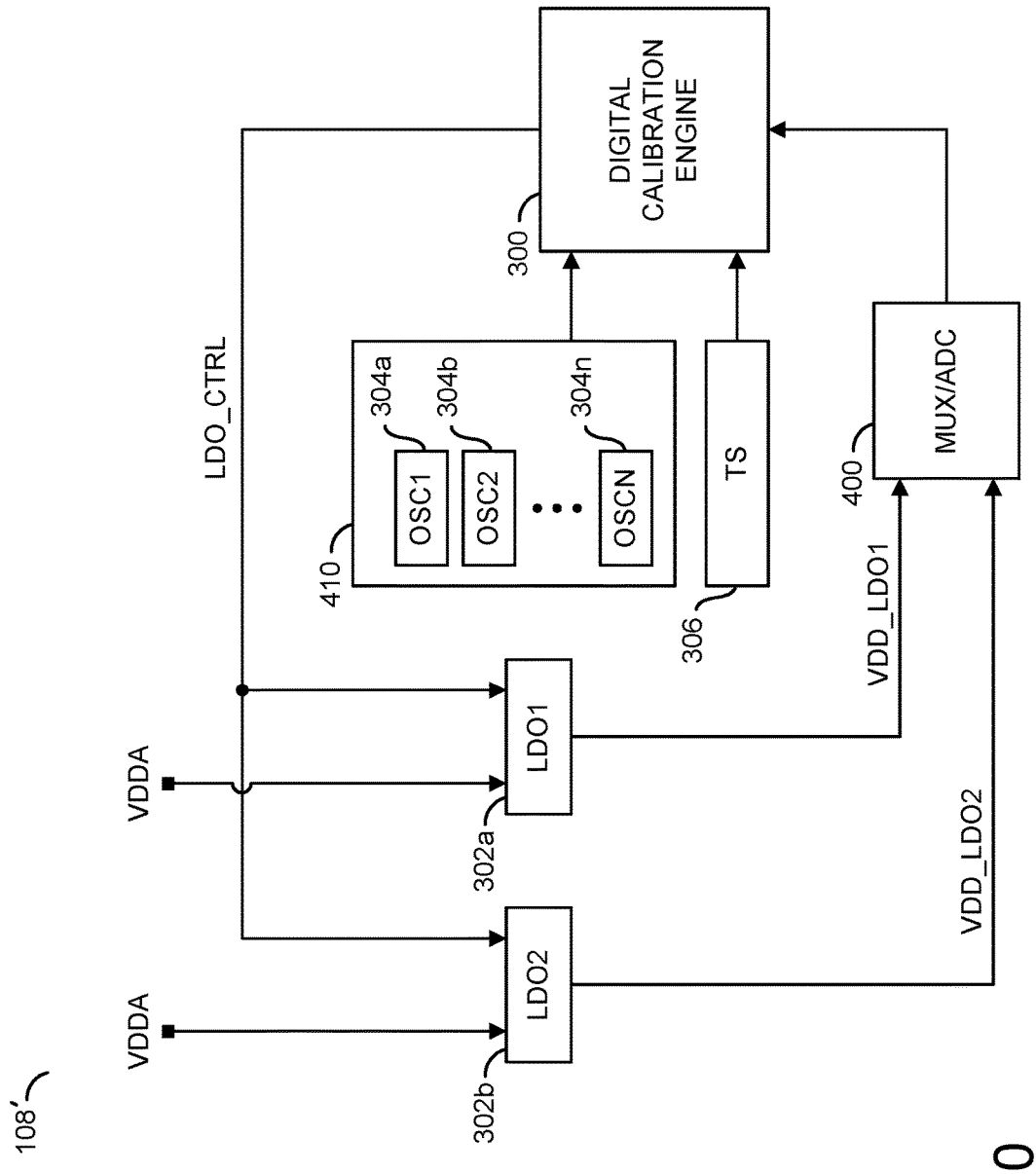
FIG. 10 is a block diagram illustrating a PVT digital calibration circuit.

Referring to FIG. 10, a block diagram illustrating the PVT digital calibration circuit 108' is shown. The PVT digital calibration circuit 108' may comprise the digital calibration engine 300, LDO regulators 302a-302b, the temperature sensor 306, a block (or circuit) 400 and/or a block (or circuit) 410. The circuit 400 may implement a multiplexor and/or an analog-to-digital converter (ADC). The circuit 410 may implement an oscillator block. The oscillator block 410 may comprise a number of the oscillators 304a-304n. The PVT calibration circuit 108' may comprise other components (not shown). The number, type and/or arrangement of the PVT digital calibration circuit 108' may be varied according to the design criteria of a particular implementation.

The LDO regulators 302a-302b may each receive the signal VDDA. The digital calibration engine 300 may be configured to present the signal LDO_CTRL to each of the LDO regulators 302a-302b. The signal LDO_CTRL may program the LDO regulators 302a-302b to compensate for a voltage drift of the signal VDDA. The LDO regulator 302a may generate a signal (e.g., VDD_LDO1) and the LDO regulator 302b may generate a signal (e.g., VDD_LDO2) in response to the signal VDDA and the signal LDO_CTRL. The signal VDD_LDO1 and/or the signal VDD_LDO2 may be presented to the ADC 400 and/or the delayline circuit 102 to compensate for a voltage drift (e.g., on the signal VDDA).

The ADC 400 may receive the signal VDD_LDO1 and/or the signal VDD_LDO2. The ADC 400 may be configured to receive multiple inputs and present an output (e.g., a multiplexor operation). The ADC 400 may be configured to convert an analog signal (e.g., the signal VDD_LDO1 and/or the signal VDD_LDO2) to a digital signal. The ADC 400 may present digital data to the digital calibration engine 300. In the example shown, the ADC 400 may implement a 10-bit analog-to-digital converter. In some embodiments, the ADC 400 may implement an 8-bit analog-to-digital converter. In some embodiments, the analog-to-digital converter may be greater than 10 bits. Generally, a 10-bit analog-to-digital converter may be suitable for DDR4 and/or DDR5 applications.

The digital calibration engine 300 may receive the digital data from the ADC 400. The digital calibration engine 300 may receive data from the temperature sensor 306 and/or the oscillator block 410. The digital calibration engine 300 may be configured to monitor the LDO regulators 302a-302b, the frequencies of the oscillators 304a-304n and/or temperature from the temperature sensor 306. The digital calibration engine 300 may perform the digital calibration to compensate for the process, voltage drift and/or temperature. The digital calibration engine 300 may monitor the available data to determine an amount of drift (e.g., from the target delay) and tune the digital calibration code to maintain a constant output voltage (e.g., from the LDO regulators 302a-302b). Maintaining a constant output voltage may help the critical timing path and improve the timing closure.

The digital calibration engine 300 may implement a sampling rate for reading data and/or performing the digital calibration. In one example, the calibration may be of a millisecond order. In another example, the calibration may be of a microsecond order. In some embodiments, one calibration may be performed to determine how many sample points provide sufficient information.

The oscillator block 410 may be configured to implement multiple oscillator circuits 304a-304n across a die (e.g., a multi-core ring oscillator). The oscillators 304a-304n may read the frequency delivered (e.g., the frequency may be affected by the process). In some embodiments, implementing multiple oscillators 304a-304n may replace a functionality of the temperature sensor 306 (e.g., the multiple oscillators 304a-304n may be implemented instead of the temperature sensor 306). For example, a temperature sensor 306 may utilize a large amount of area compared to the multiple oscillators 304a-304n. The digital calibration engine 300 may read the frequencies from the oscillators 304a-304n to determine how much drift has occurred. For example, if one of the oscillators 304a-304n is located in a hot area, and another of the oscillators 304a-304n is located in a cold area, the digital calibration engine 300 may read the frequencies to determine how much the temperature has drifted based on the difference in frequencies.

Figure 11:
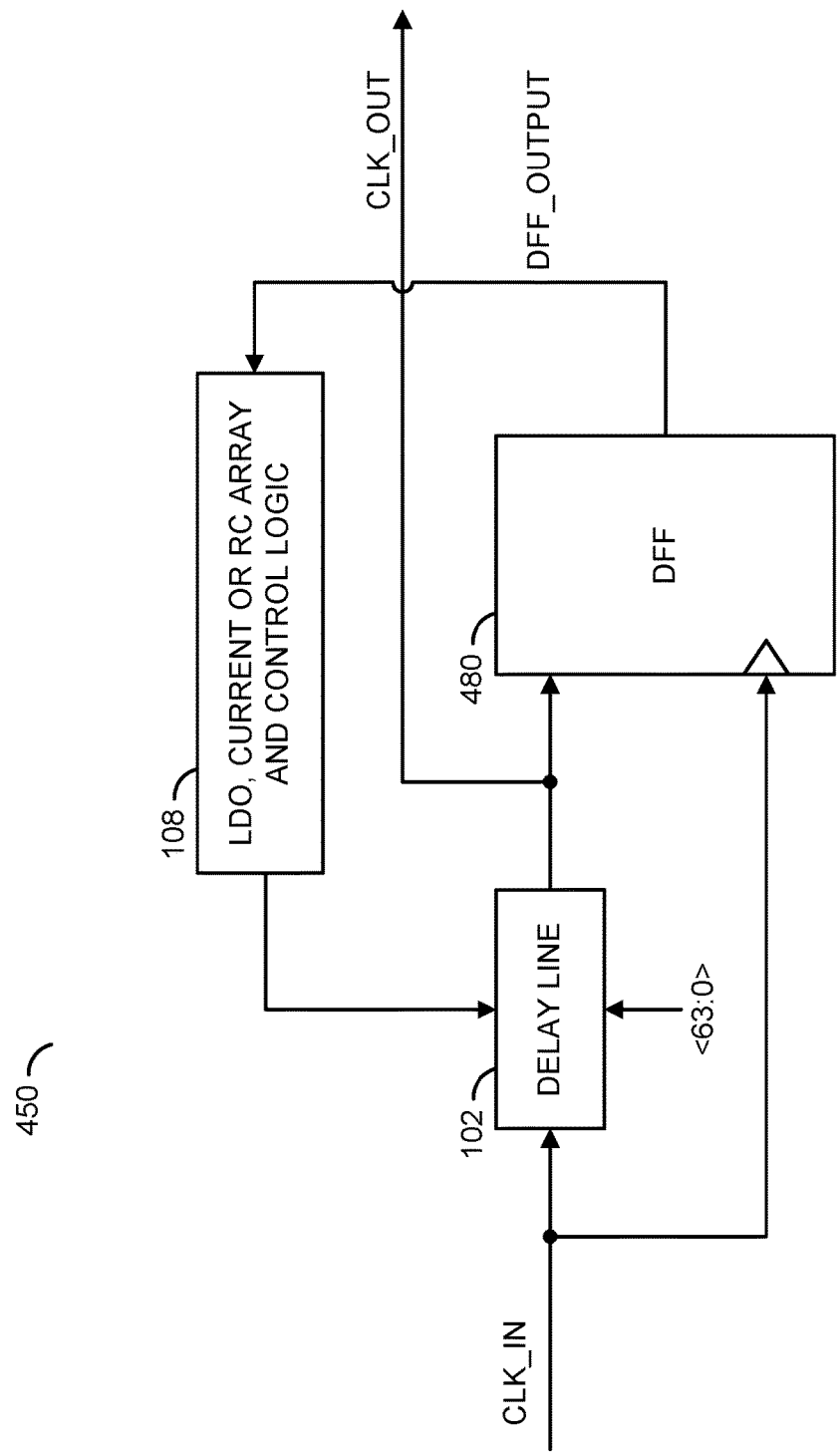
FIG. 11 is a block diagram illustrating a delay line calibration.

Referring to FIG. 11, a block diagram illustrating a system 450 for delay line calibration is shown. The system 450 may comprise the delayline circuit 102, the calibration circuit 108 and/or a block (or circuit) 480. The circuit 480 may implement a flip-flop. In an example, the flip-flop 480 may implement a D flip-flop (e.g., a multi-bit circuit). In an example, the calibration circuit 108 may comprise the LDO regulators 304a-304b, a current and/or RC array, and/or control logic.

A signal (e.g., CLK_IN) may be presented to the delayline circuit 102. The delayline circuit 102 may present a signal (e.g., CLK_OUT). The signal CLK_IN may be presented to a clock input of the flip-flop 480. The signal CLK_OUT may be presented to the input of the flip-flop 480. The flip-flop 480 may generate a signal (e.g., DFF_OUTPUT). The flip-flop 480 may present the signal DFF_OUTPUT to the calibration circuit 108. The calibration circuit 108 may control the LDO regulators (e.g., the LDO regulators 302a-302b using the signal LDO_CTRL) and/or the delayline circuit 102 (e.g., using the signal DLYCTL). The temperature sensor 306 and/or the ring oscillator 304 may be used to track the PVT (process, voltage and temperature) variation. The flip-flop 480 may be configured to provide information (e.g., the signal DFF_OUTPUT) to the calibration circuit 108 about the difference between the signal CLK_IN input to the delayline circuit 102 and the signal CLK_OUT output from the delayline circuit 102.

Figure 12:
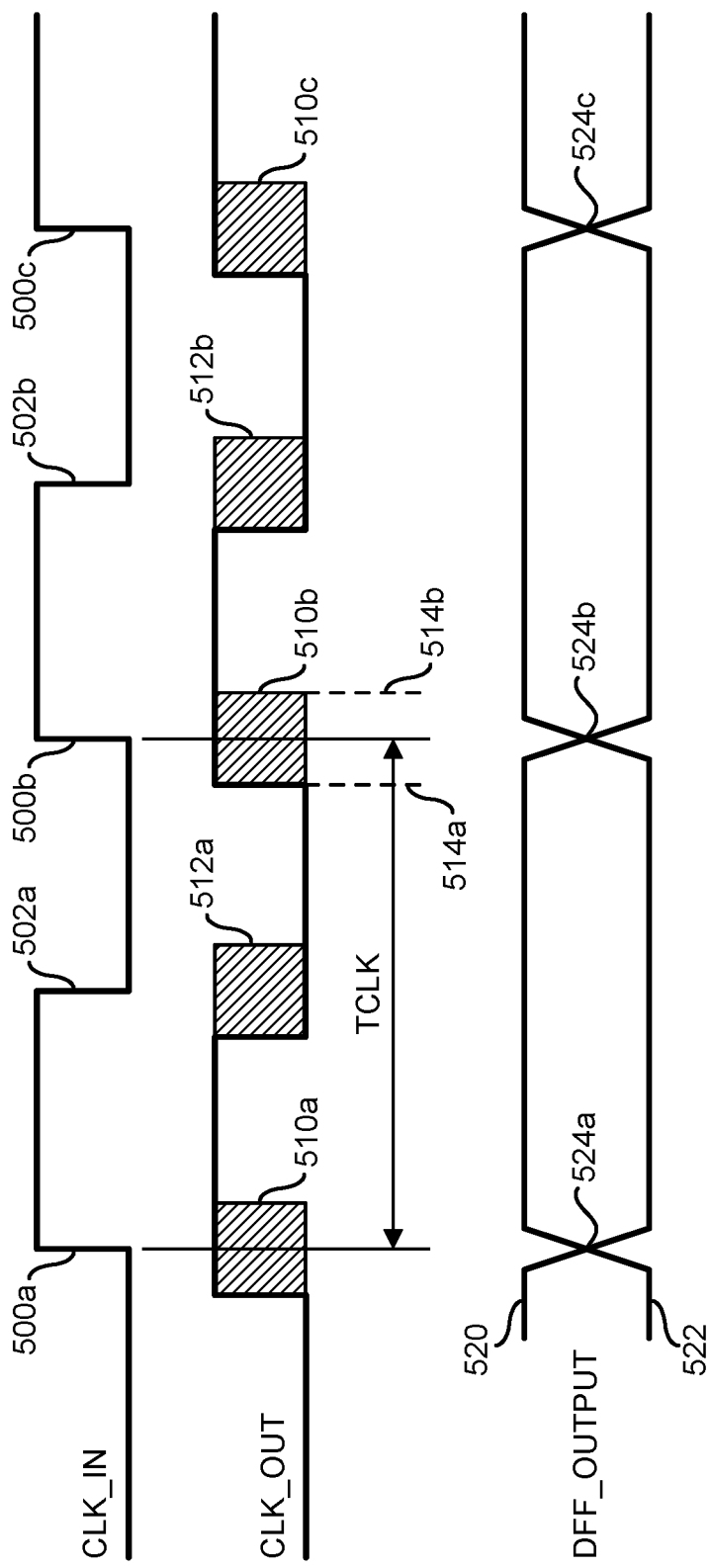
FIG. 12 is a timing diagram illustrating a delay line calibration.

Referring to FIG. 12, a timing diagram illustrating a delay line calibration is shown. A portion of a waveform of the signal CLK_IN is shown. A portion of a waveform of the signal CLK_OUT is shown. A portion of a waveform for the signal DFF_OUTPUT is shown.

The waveform CLK_IN may comprise a number of rising edges 500a-500c and a number of falling edges 502a-502b. For example, the waveform CLK_IN may represent a reference clock signal. The signal CLK_OUT may have a number of rising sections 510a-510c and a number of falling sections 512a-512b. Lines 514a-514b are shown. The lines 514a-514b may represent a width of the sections 510a-510c and/or 512a-512b. The signal DFF_OUTPUT may comprise a waveform 520 (e.g., a Q output from the D flip-flop 480) and a waveform 522 (e.g., a Q' output from the D flip-flop 480). A number of cross-over points 524a-524c are shown. The cross-over points 524a-524b may represent when the values of the waveform 520 and the waveform 522 flip (e.g., from logical '0' to logical '1' or from logical '1' to logical '0').

The signal CLK_OUT may lead the signal CLK_IN. The rising sections 510a-510c and/or the falling sections 512a-512c may indicate an amount of compensation to be performed to keep the timing constant. The cross-over points 524a-524c may occur at approximately the time of the rising edges 500a-500c. For example, the cross-over points 524a-524c may occur at approximately the middle of the rising sections 510a-510c.

Figure 13:
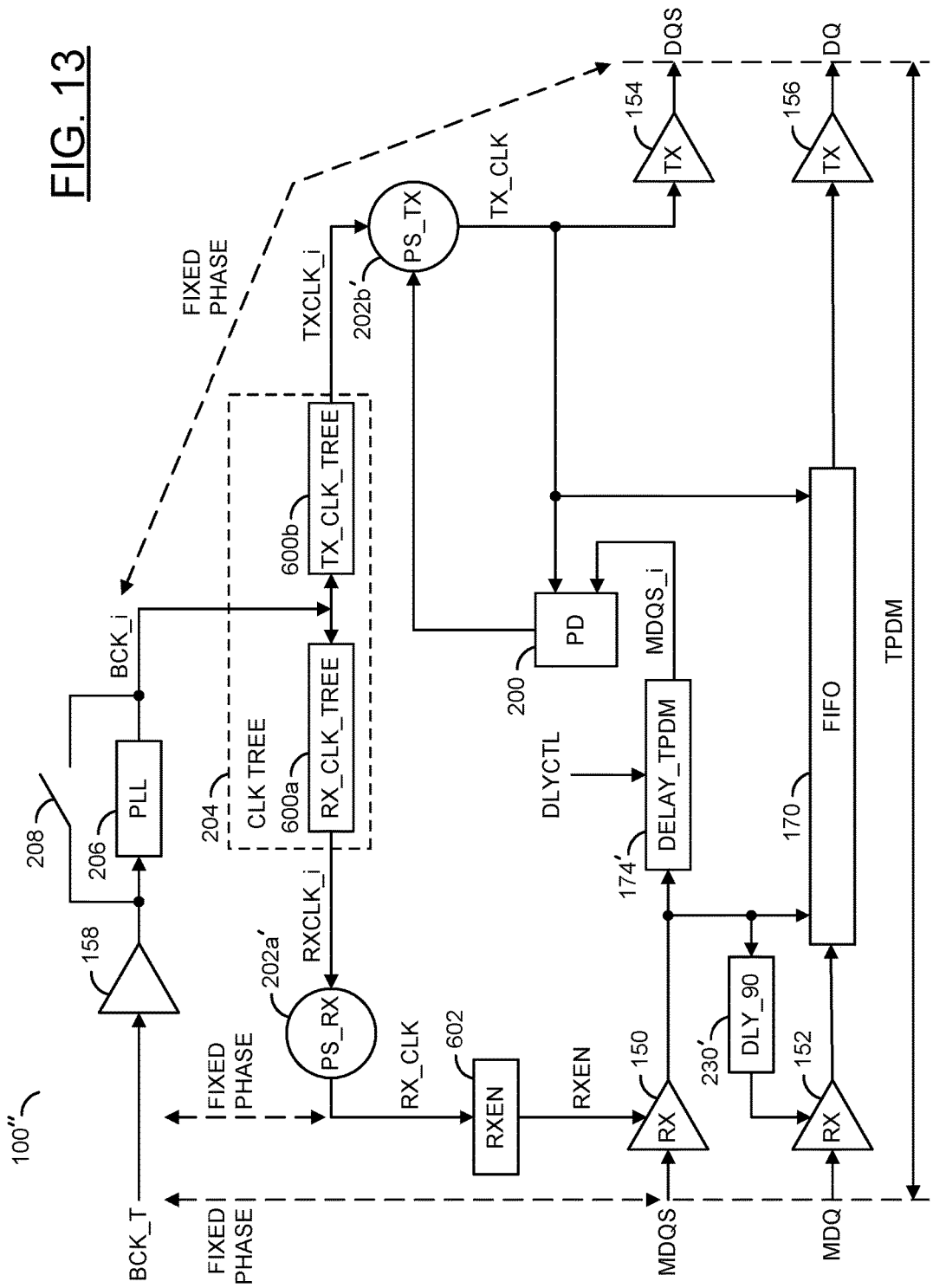
FIG. 13 is a block diagram illustrating an alternate embodiment of an open loop architecture.

Referring to FIG. 13, a block diagram illustrating an alternate embodiment of an open loop architecture 100" is shown. The apparatus 100" may comprise the MDQS input buffer 150, the MDQ input buffer 152, the DQS output buffer 154, the DQ output buffer 156, the BCK input buffer 158, the FIFO circuit 170, the variable delay circuit (or phase blender, or phase interpolator) 174', the phase detector 200, phase interpolators (or phase blenders, or variable delay circuits) 202a'-202b', the clock tree 204, the small PLL 206, the PLL bypass switch 208, the variable delay circuit (or phase interpolator, or phase blender) 230', blocks (or circuits) 600a-600b and/or a block (or circuit) 602. The apparatus 100" may comprise other components (not shown). The number, type and/or arrangement of the components of the apparatus 100" may be varied according to the design criteria of a particular implementation.

The apparatus 100" may provide implementation details for adjusting the tPDM and/or the open loop architecture. The apparatus 100" may be configured to maintain a fixed phase between the signal BCK_T and the signals MDQS and/or MDQ. The apparatus 100" may be configured to maintain a fixed phase between a signal (e.g., BCK_i) and the signals DQS and/or DQ. For example, the phase blender 202a' may be configured to align the phase of the signal BCK and the signal MDQ on the receive (Rx) side. In another example, the phase blender 202b' may be configured to align the phase of the signal BCK_i and the signal DQ on the transmit (Tx) side. Once the phases are aligned, the apparatus 100" may be configured to give one total delay to achieve the desired tPDM delay amount (e.g., 1.5 ns).

The signal BCK_i may be generated in response to the signal BCK_T, the BCK buffer 158, the PLL 206 and/or the PLL bypass switch 208. In an example, the signal BCK_i may represent a clean version of the input clock signal BCK_T. For example, when the signal BCK_T has noise, the PLL 206 may reduce the noise and generate the signal BCK_i. In another example, when the signal BCK_T has low amounts of noise, the PLL bypass switch 208 may bypass the PLL 206 and the output from the BCK input buffer 158 may be used as the signal BCK_i.

The clock tree 204 may comprise a Rx clock tree portion 600a (e.g., RX_CLK_TREE) and a Tx clock tree portion 600b (e.g., TX_CLK_TREE). The Rx clock tree portion 600a may be implemented to distribute the clean reference clock signal BCK_i to the Rx side of the apparatus 100" (e.g., to manage the memory interface 104). The Rx clock tree portion 600a may provide a signal (e.g., RXCLK_i) in response to the signal BCK_i. The signal RXCLK_i may have some delay from the Rx clock tree portion 600a compared to the signal BCK_i. Similarly, the Tx clock tree portion 600b may be implemented to distribute the clean reference clock signal BCK_i to the Tx side of the apparatus 100" (e.g., to manage the host interface 106). The Tx clock tree portion 600b may provide a signal (e.g., TXCLK_i) in response to the signal BCK_i. The signal TXCLK_i may have some delay from the Tx clock tree portion 600b compared to the signal BCK_i. A phase interpolator (e.g., the phase interpolators 202a'-202b') may be implemented on both sides (e.g., Rx and Tx) after the clock tree 204.

The phase interpolator 202a' may receive the signal RXCLK_i. The phase interpolator 202a' may generate a signal (e.g., RX_CLK) in response to the signal RXCLK_i. The signal RX_CLK may be in phase with the signal BCK_T (e.g., the signal BCK_T and the signal RX_CLK may have a fixed phase). For example, the phase interpolator 202a' may implement a delay amount (e.g., PS_RX). The signal RX_CLK may be presented to the circuit 602.

The circuit 602 may be an Rx enable circuit. The Rx enable circuit 602 may generate a signal (e.g., RXEN) in response to the signal RX_CLK. The signal RXEN may be configured to enable the input MDQS buffer 150. In some embodiments, the Rx enable circuit 602 may comprise the flip-flop circuit 162, the command decoder 164 and/or the digital control circuit 166.

The MDQS input buffer 150 may be managed by the signal RXEN. For example, the signal RXEN may keep the signal MDQS in phase (e.g., in a fixed phase relationship) with the reference clock signal BCK_T. The signal MDQS may be presented to the variable delay circuit 174', the variable delay circuit 230' and/or the FIFO circuit 170. The variable delay circuit 230' may be configured to manage the MDQ input buffer 152. For example, the variable delay circuit 230 may be configured to keep the signal MDQ in phase (e.g., in a fixed phase relationship) with the reference clock signal BCK_T. In some embodiments, the variable delay circuit 230' may control a clock input to a flip-flop circuit (e.g., as shown in association with FIG. 6).

The variable delay circuit (or phase blender or phase interpolator) 174' may be configured to generate a signal (e.g., MDQS_i) in response to the signal MDQS and the signal DLYCTL (e.g., received from the calibration circuit 108). The signal MDQS_i may be the delayed version of the signal MDQS. The delayed signal MDQS_i may be presented to one input of the phase detector 200.

The phase interpolator 202b' may receive the signal TXCLK_i and the output from the phase detector 200. The phase interpolator 202b' may generate a signal (e.g., TX_CLK) in response to the signal TX_CLK_i and the output from the phase detector 200. The signal TX_CLK may be in phase with the signal BCK_i (e.g., the signal BCK_i and the signal TX_CLK may have a fixed phase). For example, the phase interpolator 202b' may implement a delay amount (e.g., PS_TX). The phase detector 200 may be configured to switch to the BCK domain for jitter clean up.

The signal TX_CLK may be presented to one input of the phase detector 200, the FIFO circuit 170 and/or the DQS output buffer 154. The variable delay circuit 174', the phase detector 200 and/or the phase interpolator 202b' may be configured to convert and/or slow the signal TX_CLK_i until the phase is locked with the signal BCK_i. The locked phase signal TX_CLK may be presented to the FIFO circuit 170 to control the tPDM delay. The locked phase signal TX_CLK may be presented to the DQS output buffer 154 to ensure the signal DQS is in a fixed phase relationship with the signal BCK_i.

Figure 14:
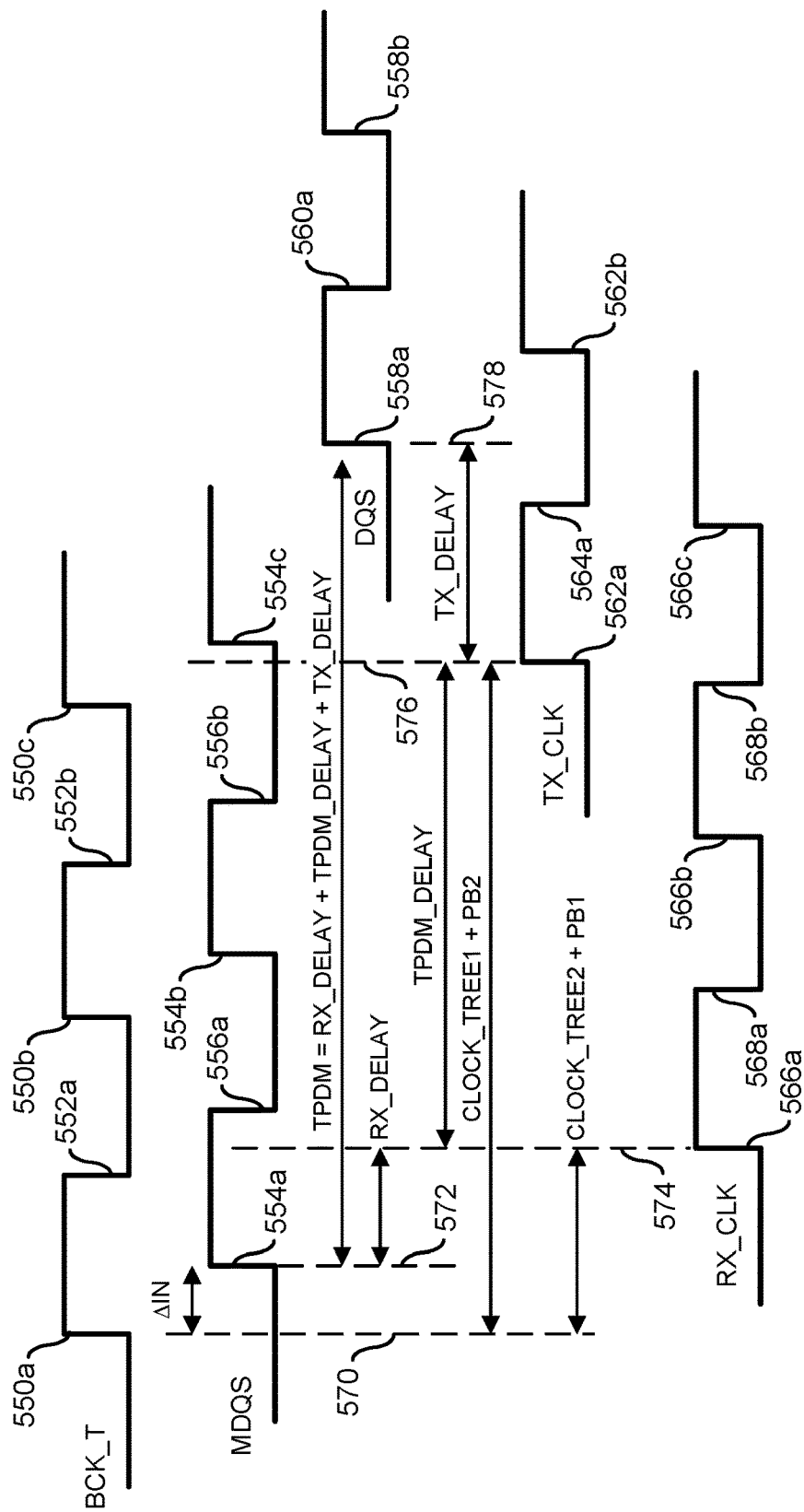
FIG. 14 is a timing diagram illustrating a tPDM delay.

Referring to FIG. 14, a timing diagram illustrating a tPDM delay is shown. A portion of a waveform of the signal BCK_T is shown. A portion of a waveform of the signal MDQS is shown. A portion of a waveform for the signal DQS is shown. A portion of a waveform of the signal TX_CLK is shown. The signal TX_CLK may be a clock signal for the host interface 106. In an example, the signal TX_CLK may be the signal BCK shown in association with FIG. 6 provided to the output buffer 154. A portion of a waveform for the signal RX_CLK is shown. The signal RX_CLK may be a clock signal for the memory interface 106. In an example, the signal RX_CLK may be provided to the input buffer 150.

The waveform BCK_T may comprise a number of rising edges 550a-550c and a number of falling edges 552a-552b. For example, the waveform BCK_T may represent the reference clock signal provided to the buffer 158. The signal MDQS may have a number of rising edges 554a-554c and a number of falling edges 556a-556b. The signal DQS may have a number of rising edges 558a-558b and a falling edge 560a. The signal TX_CLK may have a number of rising edges 562a-562b and a falling edge 564a. The signal RX_CLK may have a number of rising edges 566a-566c and a number of falling edges 568a-568b.

Vertical lines 570-578 are shown. The line 570 may represent a time of the rising edge 550a of the signal BCK_T. The line 572 may represent a time of the rising edge 554a of the signal MDQS. The line 574 may represent a time of the rising edge 566a of the signal RX_CLK. The line 576 may represent a time of the rising edge 562a of the signal TX_CLK. The line 578 may represent a time of the rising edge 558a of the signal DQS.

An amount of time (e.g., ΔIN) is shown between the line 570 and the line 572. The signal MDQS may lead the signal BCK_T by the time ΔIN. For example, the phase interpolator 202 (shown in association with FIG. 6) may align the phase of the signal BCK_T with the phase of the signal MDQS (e.g., reduce ΔIN to zero). Generally, the signal BCK_T may be received and the signal MDQS may be variable. The circuit 230 may be adjusted to make the signal MDQS sample the signal MDQ at the center of the eye of the signal MDQ.

An amount of time (e.g., CLOCK_TREE2+PB1) is shown between the line 570 and the line 574. For example, the value CLOCK_TREE2 may be a delay inherent to the Rx clock tree 600a and the value PB1 may be generated in response to the delay circuit 202a'. An amount of time (e.g., CLOCK_TREE1+PB2) is shown between the line 570 and the line 576. For example, the value CLOCK_TREE1 may be a delay inherent to the Tx clock tree 600b and the value PB2 may be generated in response to the delay circuit 202b'.

An amount of time (e.g., RX_DELAY) is shown between the line 572 and the line 574. The value RX_DELAY may be a delay inherent to the input buffer 150. The value RX_DELAY may be the Rx value shown in the equations EQ1-EQ3. In one example, the value RX_DELAY may be a variable amount of approximately 300 ps. An amount of time (e.g., TX_DELAY) is shown between the line 576 and the line 578. The value TX_DELAY may be a delay inherent to the output buffer 156. The value TX_DELAY may be the Tx value shown in the equations EQ1-EQ3. In one example, the value TX_DELAY may be a variable amount of approximately 300 ps. An amount of time (e.g., TPDM_DELAY) is shown between the line 574 and the line 576. The value TPDM_DELAY may be an amount of delay inserted to achieve the target delay amount.

An amount of time (e.g., TPDM) is shown between the line 572 and the line 578. The value TPDM may be the total relationship between when the signal MDQS is received and the signal DQS is output. In one example, the total delay from the rising edge 554a of the signal MDQS to the rising edge 558a of the output DQS may be 1.5 ns as a target value. Internally, the apparatus 100 may have an internal delay amount Rx (e.g., RX_DELAY) and an internal delay amount Tx (e.g., TX_DELAY) that may be variable (e.g., approximately 300 ps-600 ps). The apparatus 100 may be configured to insert a delay (e.g., TPDM_DELAY) and/or the delay of the FIFO 170 to generate the tPDM delay amount (e.g., the value TPDM).

Although embodiments of the invention have been described in the context of a DDR4 application, the present invention is not limited to DDR4 applications, but may also be applied in other high data rate digital communication applications where different transmission line effects, cross-coupling effects, traveling wave distortions, phase changes, impedance mismatches and/or line imbalances may exist. The present invention addresses concerns related to high speed communications, flexible clocking structures, specified command sets and lossy transmission lines. Future generations of DDR can be expected to provide increasing speed, more flexibility, additional commands and different propagation characteristics. The present invention may also be applicable to memory systems implemented in compliance with either existing (legacy) memory specifications or future memory specifications.

The functions and structures illustrated in the diagrams of FIGS. 1 to 14 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
an open loop circuit configured to generate an in-phase clock signal by performing a phase alignment in response to (i) a clean version of a system clock and (ii) a delayed version of a strobe signal; and
a delay circuit configured to (i) generate said delayed version of said strobe signal in response to (a) said strobe signal received from a memory interface and (b) a delay amount received from a calibration circuit, (ii) adjust a delay of transferring a data signal through said apparatus in response to (a) said delay amount and (b) said in-phase clock signal and (iii) present said in-phase clock signal and said data signal to a host interface, wherein (A) said data signal is received from said memory interface and (B) said delay of transferring said data signal is implemented to keep a latency of a data transfer within a pre-defined range.

2. The apparatus according to claim 1, wherein said apparatus is implemented in a data buffer of a memory module.

3. The apparatus according to claim 1, wherein said apparatus is implemented in a registered clock driver of a memory module.

4. The apparatus according to claim 1, wherein said apparatus is portable to different processes.

5. The apparatus according to claim 1, wherein said apparatus reduces a power consumption compared to a PLL/DLL solution.

6. The apparatus according to claim 1, wherein said apparatus is configured to operate at frequencies in a range of approximately 0.5 GHz and 20 GHz.

7. The apparatus according to claim 1, wherein said apparatus is configured to reduce jitter on said strobe signal and said data signal received from a DRAM memory module.

8. The apparatus according to claim 1, further comprising a phase detector to implement said phase alignment, wherein said phase alignment is a zero phase.

9. The apparatus according to claim 1, further comprising a PLL circuit configured to generate said clean version of said system clock in response to said system clock.

10. The apparatus according to claim 9, wherein said PLL circuit does not perform a locking operation.

11. The apparatus according to claim 9, further comprising a bypass switch configured to bypass said PLL circuit when said system clock is clean enough to be used for said phase alignment.

12. The apparatus according to claim 1, wherein said apparatus implements an open loop architecture with digital calibration.

13. The apparatus according to claim 1, wherein said pre-defined range is approximately 0.1 ns to 10 ns.

14. The apparatus according to claim 1, wherein said calibration circuit is configured to maintain said delay by compensating for a temperature drift and a voltage drift.

15. The apparatus according to claim 1, wherein said delay circuit is configured to delay said strobe signal and sample said data signal using said strobe signal.

16. The apparatus according to claim 1, wherein (i) said delay circuit further comprises a first-in first-out circuit to reduce amount of jitter on said data signal and (ii) said delay of transferring said data signal through said apparatus includes a delay from said first-in first-out circuit.

17. The apparatus according to claim 1, wherein said delay is calibrated to 6.5 cycles of said clean version of said system clock.

18. The apparatus according to claim 1, wherein said calibration circuit comprises a digital calibration engine, a low-dropout regulator and an oscillator.

19. The apparatus according to claim 1, wherein a digital calibration engine and a plurality of fine tune delay circuits are implemented in said host interface to align a skew between said in-phase clock signal and said data signal.

20. The apparatus according to claim 1, wherein said open loop circuit and said delay circuit are configured to swap said strobe signal for said clean version of said system clock on a DQS path.

* * * * *